(12) United States Patent
Yang et al.

(10) Patent No.: US 12,364,016 B2
(45) Date of Patent: Jul. 15, 2025

(54) DISPLAY SUBSTRATE INCLUDING A SHIFT REGISTER AT AN EDGE AREA OF A BASE SUBSTRATE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhongliu Yang, Beijing (CN); Tiaomei Zhang, Beijing (CN); Wenbo Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/264,062

(22) PCT Filed: Aug. 5, 2022

(86) PCT No.: PCT/CN2022/110475
§ 371 (c)(1),
(2) Date: Aug. 2, 2023

(87) PCT Pub. No.: WO2023/016358
PCT Pub. Date: Feb. 16, 2023

(65) Prior Publication Data
US 2024/0313001 A1 Sep. 19, 2024

(30) Foreign Application Priority Data
Aug. 10, 2021 (CN) .......................... 202110912786.4

(51) Int. Cl.
*H10D 86/60* (2025.01)
*G09G 3/32* (2016.01)
(Continued)

(52) U.S. Cl.
CPC ............... *H10D 86/60* (2025.01); *G09G 3/32* (2013.01); *G11C 19/28* (2013.01); *H10D 86/441* (2025.01);
(Continued)

(58) Field of Classification Search
None
See application file for complete search history.

(56) References Cited

U.S. PATENT DOCUMENTS

2015/0332632 A1* 11/2015 Nakata ................. G09G 3/3607
345/690
2016/0260402 A1* 9/2016 Otose ................... G11C 19/287
(Continued)

FOREIGN PATENT DOCUMENTS

CN 105469764 B * 11/2018
CN 109658865 A * 4/2019 ........... G09G 3/3208
(Continued)

*Primary Examiner* — Kirk W Hermann
(74) *Attorney, Agent, or Firm* — BROOKS KUSHMAN P.C.

(57) ABSTRACT

A display substrate including a base and a shift register unit provided on the base; the shift register unit includes a first first voltage line, an on-off control circuit, a first energy storage circuit and a fourth node control circuit; the on-off control circuit comprises a first transistor, and the first energy storage circuit includes a first capacitor; at least part of the first first voltage line extends in the a first direction; the fourth node control circuit includes a second transistor; the first capacitor, the first transistor, the first first voltage line and the second transistor are arranged in a second direction; the second transistor, the first first voltage line, the first transistor and the first capacitor are arranged in
(Continued)

sequence along a direction close to the display area; the first direction intersects the second direction.

19 Claims, 6 Drawing Sheets

(51) Int. Cl.
    *G11C 19/28*         (2006.01)
    *H10D 86/40*       (2025.01)

(52) U.S. Cl.
    CPC ............... *G09G 2300/0426* (2013.01); *G09G 2300/0809* (2013.01); *G09G 2310/0286* (2013.01); *H10D 86/481* (2025.01)

(56) References Cited

U.S. PATENT DOCUMENTS

| | | | |
|---|---|---|---|
| 2017/0032752 A1* | 2/2017 | Huang | G11C 19/28 |
| 2017/0061922 A1* | 3/2017 | Wang | G11C 19/188 |
| 2019/0164504 A1* | 5/2019 | Hayashi | G09G 3/344 |
| 2020/0176603 A1* | 6/2020 | Baeck | H10K 59/126 |
| 2022/0068212 A1 | 3/2022 | Yao et al. | |
| 2022/0367730 A1 | 11/2022 | Qian et al. | |
| 2023/0094945 A1 | 3/2023 | Bi et al. | |

FOREIGN PATENT DOCUMENTS

| | | |
|---|---|---|
| CN | 111508974 A | 8/2020 |
| CN | 111816691 A | 10/2020 |
| CN | 112435593 A | 3/2021 |

* cited by examiner

DISPLAY SUBSTRATE INCLUDING A SHIFT REGISTER AT AN EDGE AREA OF A BASE SUBSTRATE, AND DISPLAY DEVICE

CROSS-REFERENCE TO RELATED APPLICATIONS

This application is the U.S. national phase of PCT Application No. PCT/CN2022/110475 filed on Aug. 5, 2022, which claims priority to Chinese Patent Application No. 202110912786.4 filed on Aug. 10, 2021, which are incorporated herein by reference in their entireties.

TECHNICAL FIELD

The present disclosure relates to the technical field of display, and more particularly, to a display substrate, and a display device.

BACKGROUND

The existing display substrate cannot ensure that the output signal of the shift register unit is stable while ensuring that the original PPI (Pixel per inch) does not change.

SUMMARY

In one aspect, an embodiment of the present disclosure provide a display substrate comprising a base and a shift register unit provided on the base; the shift register unit comprises a first first voltage line, an on-off control circuit, a first energy storage circuit and a fourth node control circuit; the base comprises an edge area and a display area, and the shift register unit is disposed at the edge area; the on-off control circuit comprises a first transistor, and the first energy storage circuit comprises a first capacitor; the fourth node control circuit comprises a second transistor;
  at least part of the first first voltage line extends in a first direction;
  the first capacitor, the first transistor, the first first voltage line and the second transistor are arranged in a second direction; the second transistor, the first first voltage line, the first transistor and the first capacitor are arranged in sequence along a direction close to the display area;
  the first direction intersects the second direction.

Optionally, the first transistor comprises a first active pattern, at least part of the first active pattern extending in the first direction;
  the gate electrode of the first transistor is located in a different layer from the first first voltage line; the gate electrode of the first transistor is coupled to a first conductive connection portion, and the first conductive connection portion is coupled to the first first voltage line through a via hole.

Optionally, the shift register unit further comprises a first clock signal line, a second clock signal line, a second energy storage circuit and a fourth node control circuit, and the second energy storage circuit comprises a second capacitor;
  the second capacitor is located on a side of the first first voltage line away from the display area;
  the first clock signal line and the second clock signal line are located on a side of the second capacitor away from the first first voltage line.

Optionally, a first plate of the second capacitor is coupled to a second conductive connection portion, a first electrode of the first transistor is electrically connected to a third conductive connection portion through a via hole, and the third conductive connection portion is coupled to the second conductive connection portion through a via hole, so that the first electrode of the first transistor is coupled to the first plate of the second capacitor;
  the second plate of the second capacitor is coupled to a first connecting conductive part that is coupled to the first clock signal line through a via hole such that the second plate of the second capacitor is coupled to the first clock signal line.

Optionally, an orthographic projection of the second plate of the second capacitor on the base does not overlap with an orthographic projection of the first first voltage line on the base.

Optionally, a gate electrode of the second transistor is coupled to a fourth conductive connection portion;
  a second electrode of the first transistor is coupled to a fifth conductive connection portion through a via hole;
  the fourth conductive connection portion is coupled to the fifth conductive connection portion through a via hole such that the second electrode of the first transistor is coupled to the gate electrode of the second transistor.

Optionally, the fourth node control circuit further comprises a third transistor; the third transistor is arranged between the first clock signal line and the first first voltage line;
  a first electrode of the third transistor is coupled to the first first voltage line, and a second electrode of the third transistor is coupled to a sixth conductive connection portion through a via hole; the sixth conductive connection portion is coupled to the second electrode of the second transistor through a via hole so that the second electrode of the third transistor is coupled to the second electrode of the second transistor;
  a gate electrode of the third transistor is coupled to a seventh conductive connection portion and an eighth conductive connection portion, and the seventh conductive connection portion is coupled to the second clock signal line through a via hole;
  the first electrode of the second transistor is coupled to a ninth conductive connection portion through a via hole, and the ninth conductive connection portion is coupled to the eighth conductive connection portion through a via hole such that the first electrode of the second transistor is coupled to the gate electrode of the third transistor.

Optionally, the shift register unit further comprises a second voltage line and a first node control circuit; the second voltage line is located on a side of the first first voltage line close to the display area; the first node control circuit comprises a fourth transistor, a fifth transistor and a sixth transistor; the fourth transistor, the fifth transistor and the sixth transistor are provided between the first first voltage line and the second voltage line;
  the fourth transistor comprises a fourth active pattern, the fifth transistor comprises a fifth active pattern, and the sixth transistor comprises a sixth active pattern; the fourth active pattern, the fifth active pattern and the sixth active pattern are integrally formed;
  a first end of the sixth active pattern is coupled to the second voltage line; a second end of the fourth active pattern is coupled to the fifth conductive connection portion through a via hole.

Optionally, the fourth node control circuit further comprises a third transistor; the fourth transistor is located on a side of the first first voltage line away from the third transistor; a gate electrode of the third transistor is coupled to the seventh conductive connection portion and the eighth conductive connection portion, the seventh conductive connection portion is coupled to the second clock signal line through a via hole, and the eighth conductive connection portion is coupled to the gate electrode of the fourth transistor, so that the gate electrode of the fourth transistor is coupled to the second clock signal line;

a gate electrode of the fifth transistor is coupled to a tenth conductive connection portion, and the tenth conductive connection portion is coupled to the first clock signal line through a via hole, so that the gate electrode of the fifth transistor is coupled to the first clock signal line;

the second electrode of the third transistor is coupled to the sixth conductive connection portion through a via hole, a gate electrode of the sixth transistor is coupled to an eleventh conductive connection portion, and the eleventh conductive connection portion is coupled to the sixth conductive connection portion through a via hole, such that the gate electrode of the sixth transistor is coupled to the second electrode of the third transistor.

Optionally, the shift register unit further comprises a third node control circuit; the first energy storage circuit comprises a first capacitor; the third node control circuit comprises a seventh transistor and an eighth transistor; the eighth transistor and the seventh transistor are provided between the first first voltage line and the second voltage line;

the seventh transistor comprises a seventh active pattern, and the eighth transistor comprises an eighth active pattern; the seventh active pattern and the eighth active pattern are integrally formed;

a first end of the eighth active pattern is coupled to a twelfth conductive connection portion through a via hole, and the twelfth conductive connection portion is coupled to the second voltage line, so that the first end of the eighth active pattern is coupled to the second voltage line;

a first end of the seventh active pattern is coupled to a thirteenth conductive connection portion through a via hole, and the thirteenth conductive connection portion is coupled to the second plate of the first capacitor through a via hole, so that the first end of the seventh active pattern is coupled to the second plate of the first capacitor;

the first plate of the first capacitor is coupled to the gate electrode of the sixth transistor;

a gate electrode of the eighth transistor is coupled to a fourteenth conductive connection portion, the fourteenth conductive connection portion is coupled to the fifth conductive connection portion through a via hole, and the fifth conductive connection portion is coupled to the second electrode of the first transistor through a via hole, so that the gate electrode of the eighth transistor is coupled to the second electrode of the first transistor;

a gate electrode of the seventh transistor is coupled to the gate electrode of the fifth transistor.

Optionally, the shift register unit further comprises a fifth node control circuit;

the fifth node control circuit comprises a ninth transistor;

the ninth transistor comprises a ninth active pattern, at least part of the ninth active pattern extends in the first direction, and the ninth active pattern is located between the first capacitor and the second voltage line;

a gate electrode of the ninth transistor is coupled to the first plate of the first capacitor;

a first end of the ninth active pattern is coupled to a fifteenth conductive connection portion through a via hole, a gate electrode of the seventh transistor is coupled to a sixteenth conductive connection portion, and the fifteenth conductive connection portion is coupled to the sixteenth conductive connection portion through a via hole, so that the first end of the ninth active pattern is coupled to the gate electrode of the seventh transistor; a second end of the ninth active pattern is coupled to the thirteenth conductive connection portion through a via hole such that the second end of the ninth active pattern is coupled to the second plate of the first capacitor.

Optionally, the shift register unit further comprises a third energy storage circuit, and the third energy storage circuit comprises a third capacitor;

an orthographic projection of a first plate of the third capacitor on the base, an orthographic projection of a second plate of the third capacitor on the base, and the orthographic projection of the second voltage line on the base at least partially overlap;

the first plate of the third capacitor is coupled to a seventeenth conductive connection portion through a via hole, and the seventeenth conductive connection portion is coupled to a second end of the eighth active pattern through a via hole, so that the first plate of the third capacitor is coupled to the second end of the eighth active pattern;

a second plate of the third capacitor is coupled to the second voltage line through a via hole.

Optionally, the shift register unit further comprises a first output circuit, a second output circuit and a second first voltage line; the first output circuit comprises a first output transistor, and the second output circuit comprises a second output transistor; the first output transistor and the second output transistor are located between the second voltage line and a second first voltage line, and the second first voltage line is located on a side of the second voltage line near the display area.

Optionally, the shift register unit further comprises a signal output line, a second energy storage circuit and a third energy storage circuit; the second energy storage circuit comprises a second capacitor, and the third energy storage circuit comprises a third capacitor; the first plate of the second capacitor is coupled to the second conductive connection portion;

an active layer of the first output transistor and an active layer of the second output transistor are formed by one continuous semiconductor layer, the semiconductor layer extending in a first direction;

a first electrode of the first output transistor is coupled to a second electrode of the second output transistor, the first electrode of the first output transistor is coupled to an eighteenth conductive connection portion, and the eighteenth conductive connection portion is coupled to the signal output line through a via hole;

a second electrode of the first output transistor is coupled to the second first voltage line;

a first electrode of the second output transistor is coupled to the second voltage line;

a gate electrode of the first output transistor is coupled to the second conductive connection portion, and a gate electrode of the second output transistor is coupled to the first plate of the third capacitor.

Optionally, the shift register unit comprises a first first voltage line, a second first voltage line, a second voltage line, a first clock signal line, a second clock signal line, a signal output line, a first capacitor, a second capacitor, a third capacitor, a first transistor, a second transistor, a third transistor, a fourth transistor, a fifth transistor, a sixth transistor, a seventh transistor, an eighth transistor, a ninth transistor, a first output transistor and a second output transistor;

a gate electrode of the first transistor is coupled to the first first voltage line, a first electrode of the first transistor is coupled to a first plate of the second capacitor, and a second electrode of the first transistor is coupled to a gate electrode of the second transistor;

the gate electrode of the second transistor is coupled to the second electrode of the first transistor;

a second plate of the second capacitor is coupled to the first clock signal line;

a first electrode of the third transistor is coupled to the first first voltage line, and a second electrode of the third transistor is coupled to the second electrode of the second transistor;

a gate electrode of the third transistor is coupled to the first electrode of the second transistor;

a gate electrode of the fourth transistor is coupled to the second clock signal line; a second electrode of the fourth transistor is coupled to a second electrode of the fifth transistor; a first electrode of the fifth transistor is coupled to a second electrode of the sixth transistor; a first electrode of the sixth transistor is coupled to the second voltage line;

a gate electrode of the fifth transistor is coupled to the first clock signal line, and the second electrode of the third transistor is coupled to a gate electrode of the sixth transistor;

a first electrode of the eighth transistor is coupled to the second voltage line, a first electrode of the seventh transistor is coupled to the second plate of the first capacitor, and the first plate of the first capacitor is coupled to the gate electrode of the sixth transistor; a second electrode of the seventh transistor is coupled to a second electrode of the eighth transistor;

a gate electrode of the eighth transistor is coupled to the second electrode of the first transistor, and a gate electrode of the seventh transistor is coupled to the gate electrode of the fifth transistor;

a first electrode of the ninth transistor is coupled to the gate electrode of the seventh transistor, and a second electrode of the ninth transistor is coupled to the second plate of the first capacitor; the gate electrode of the ninth transistor is coupled to the first plate of the first capacitor;

a first plate of the third capacitor is coupled to the second electrode of the eighth transistor, and a second plate of the third capacitor is coupled to the second voltage line;

a first electrode of the first output transistor is coupled to a second electrode of the second output transistor, a second electrode of the second output transistor is coupled to the signal output line, the second electrode of the first output transistor is coupled to the second first voltage line, and the first electrode of the second output transistor is coupled to the second voltage line; a gate electrode of the first output transistor is coupled to the first electrode of the first transistor, and a gate electrode of the second output transistor is coupled to the first plate of the third capacitor;

an orthographic projection of the first plate of the third capacitor on the base, an orthographic projection of the second plate of the third capacitor on the base, and an orthographic projection of the second voltage line on the base at least partially overlap.

Optionally, the first transistor, the fourth transistor, the fifth transistor, the sixth transistor, the seventh transistor, the eighth transistor, the ninth transistor and the first capacitor are arranged between the first first voltage line and the second voltage line, and the second transistor, the third transistor and the second capacitor are arranged between the first second voltage line and the first clock signal line;

the first clock signal line and the second clock signal line are arranged on a side of the first first voltage line away from the second voltage line;

the first output transistor and the second output transistor are arranged between the second voltage line and the second first voltage line; the second first voltage line is disposed on a side of the second voltage line away from the first first voltage line.

Optionally, the fourth transistor, the fifth transistor and the sixth transistor are arranged in sequence along the first direction;

the eighth transistor, the seventh transistor and the first capacitor are arranged in sequence along the first direction;

the eighth transistor, the fourth transistor and the third transistor are arranged in sequence along the second direction;

the first capacitor, the first transistor and the second transistor are arranged in sequence along the second direction;

at least part of the first clock signal line, at least part of the second clock signal line, at least part of the first first voltage line, at least part of the second first voltage line, and at least part of the second voltage line extend in the first direction.

Optionally, the display substrate further comprises a plurality of rows of pixel circuits arranged on the display area of the base, and the pixel circuit comprises a light-emitting control end;

the shift register unit corresponds to at least one row of pixel circuits;

the shift register unit comprises a signal output line coupled to a light-emitting control end of the at least one row of pixel circuits for providing a light-emitting control signal to the light-emitting control end of the at least one row of pixel circuits.

In a second aspect, an embodiment of the present disclosure further provides a display device comprising the display substrate as described above.

DETAILED DESCRIPTION

The embodiments of the present disclosure will now be described more fully hereinafter with reference to the accompanying drawings, in which some, but not all embodiments of the disclosure are shown. Based on the embodiments in the present disclosure, all other embodiments obtained by a person of ordinary skill in the art without inventive effort fall within the scope of the present disclosure.

The transistors used in all the embodiments of the present disclosure may be triodes, thin film transistors or field effect transistors, or other devices with the same characteristics. In embodiments of the present disclosure, to distinguish the two electrodes of a transistor other than the gate electrode, one of the electrodes is referred to as a first electrode while the other one is referred to as a second electrode.

In practical operation, when the transistor is a thin film transistor or a field effect transistor, the first electrode may be a drain electrode, and the second electrode may be a source electrode; alternatively, the first electrode may be a source electrode, and the second electrode may be a drain electrode.

Figure 1:
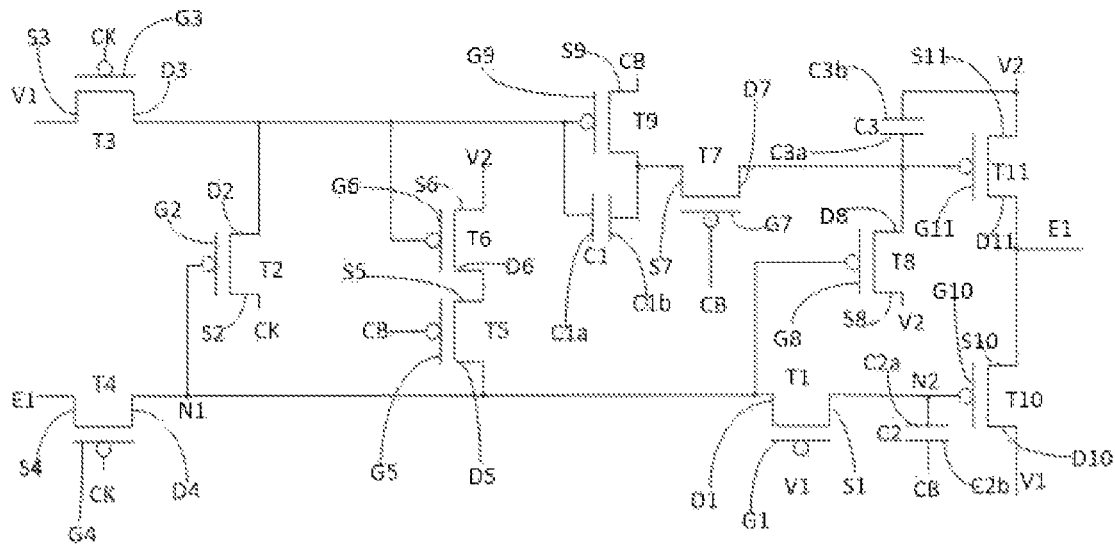
FIG. 1 is a circuit diagram of at least one embodiment of a shift register unit included in a display substrate according to an embodiment of the present disclosure.

As shown in FIG. 1, at least one embodiment of the present disclosure provides a display substrate comprising a shift register unit located at an edge area of a base; at least one embodiment of the shift register unit comprises an on-off control circuit, a first energy storage circuit, a second energy storage circuit, a third energy storage circuit, a first output circuit, a second output circuit, a first node control circuit, a third node control circuit, a fourth node control circuit and a fifth node control circuit 110; the first energy storage circuit comprises a first capacitor; the on-off control circuit comprises a first transistor;

the on-off control circuit comprises a first transistor T1, the first energy storage circuit comprises a first capacitor C1, the second energy storage circuit comprises a second capacitor C2, and the third energy storage circuit comprises a third capacitor C3; the first output circuit comprises a first output transistor T10, the second output circuit comprises a second output transistor T11, and the fourth node control circuit comprises a second transistor T2 and a third transistor T3; the first node control circuit comprises a fourth transistor T4, a fifth transistor T5 and a sixth transistor T6; the third node control circuit comprises a seventh transistor T7 and an eighth transistor T8; the fifth node control circuit comprises a ninth transistor T9;

a gate electrode G1 of the first transistor T1 is coupled to a first voltage line V1, a first electrode S1 of the first transistor T1 is coupled to a second node N2, and a second electrode D1 of the first transistor T1 is coupled to a first node N1;

a gate electrode G2 of the second transistor T2 is coupled to the second electrode D1 of the first transistor T1;

a second plate C2b of the second capacitor C2 is coupled to the first clock signal line CB;

a first electrode S3 of the third transistor T3 is coupled to the first voltage line V1, and a second electrode D3 of the third transistor T3 is coupled to a second electrode D2 of the second transistor T2;

a gate electrode G3 of the third transistor T3 and the first electrode S2 of the second transistor T2 are both coupled to a second clock signal line CK;

a first electrode S4 of the fourth transistor T4 is coupled to an input end E1;

a gate electrode G4 of the fourth transistor T4 is coupled to the second clock signal line CK; the second electrode D4 of the fourth transistor T4 is coupled to the second electrode D5 of the fifth transistor T5; A first electrode S5 of the fifth transistor T5 is coupled to a second electrode D6 of the sixth transistor T6; A first electrode S6 of the sixth transistor T6 is coupled to a second voltage line V2;

a gate electrode G5 of the fifth transistor T5 is coupled to the first clock signal line CB, and a second electrode D3 of the third transistor T3 is coupled to a gate electrode G6 of the sixth transistor T6;

a first electrode S8 of the eighth transistor T8 is coupled to the second voltage line V2, a first electrode S7 of the seventh transistor T7 is coupled to a second plate C1b of the first capacitor C1, and a first plate C1a of the first capacitor C1 is coupled to a gate electrode G6 of the sixth transistor T6; the second electrode D7 of the seventh transistor T7 is coupled to the second electrode D8 of the eighth transistor T8;

a gate electrode GQ of the eighth transistor T8 is coupled to the second electrode D1 of the first transistor T1, and the gate electrode G7 of the seventh transistor T7 is coupled to the gate electrode G5 of the fifth transistor T5;

a first electrode S9 of the ninth transistor T9 is coupled to a first clock signal line CB, and a second electrode D9 of the ninth transistor T9 is coupled to a second plate C1b of the first capacitor C1; the gate electrode G9 of the ninth transistor T9 is coupled to a first plate C1a of the first capacitor C1;

a first plate C3a of the third capacitor C3 is coupled to a second electrode D8 of the eighth transistor T8, and a second plate C3b of the third capacitor C3 is coupled to the second voltage line V2;

a first electrode S10 of the first output transistor T10 is coupled to the second electrode D11 of the second output transistor T11, the second electrode D11 of the second output transistor T11 is coupled to the signal output line E1, the second electrode D10 of the first output transistor T10 is coupled to the first voltage line V1, the first electrode S11 of the second output transistor T11 is coupled to the second voltage line V2, and the gate electrode G10 of the first output transistor T10 is coupled to the first electrode S1 of T1; the gate electrode G11 of the second output transistor T11 is coupled to the first plate C3a of the third capacitor C3.

In at least one embodiment of the shift register unit shown in FIG. 1 in the present disclosure, the gate electrode signal of T10 may be unstable due to interference of other signals, so that the signal output by E1 generates glitches, resulting in abnormal display; T1 is used to isolate T10 from interfering signals affecting it, so that the signal output by E1 is stable and the display performance is improved.

In at least one embodiment of the present disclosure, the first voltage line may be a low voltage line and the second voltage line may be a high voltage line, but is not limited thereto.

In at least one embodiment of the shift register unit shown in FIG. 1, all transistors are p-type transistors, but this is not limiting.

In the embodiments of the present disclosure, at least one embodiment of the shift register unit shown in FIG. 1 may be a light emission control driving circuit, but is not limited thereto.

In at least one embodiment of the present disclosure, the first electrode of the transistor may be a source electrode and the second electrode of the transistor may be a drain electrode; alternatively, the first electrode of the transistor may be the drain electrode and the second electrode of the transistor may be the source electrode.

In FIG. 1, the reference numeral N1 is a first node, the reference numeral N2 is a second node, the reference numeral N3 is a third node, and the reference numeral N4 is a fourth node.

Figure 2:
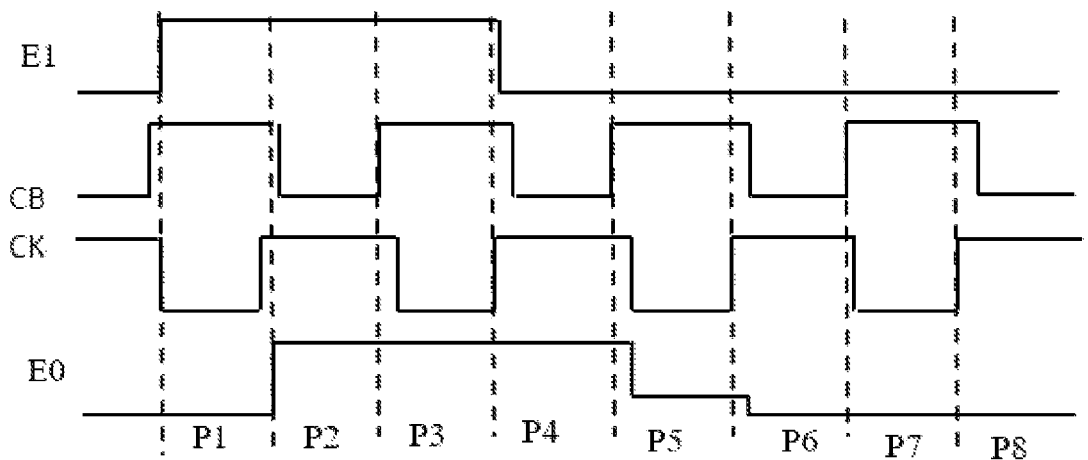
FIG. 2 is an operational timing diagram of an embodiment of the shift register unit shown in FIG. 1.

As shown in FIG. 2, when at least one embodiment of the shift register unit of FIG. 1 of the present disclosure operates, in a first time period, P1 and E1 provide a high level, CK provides a low level, T4, T3 and T1 are opened, the potential of N1 is a high level, T2 is cut off, the potential of N2 is a low level, T5, T8 and T10 are cut off, and T6 and T9 are opened; at this moment, the potential of the first electrode of T7 is at a high level, CB provides a high level, and T7 is cut off; since the voltage at two ends of the capacitor does not change abruptly, the potential of N4 is maintained at the high level of the previous frame, T11 is cut off, and the potential of the light-emitting control signal output by E1 is maintained at the low level of the previous frame;

in a second time period P2, E1 and CK provide a high level, CB provides a low level, T4, T2 and T3 are cut off, the potential of N2 keeps the low level, T5, T6 and T9 are opened, the potential of N1 is the high level, the potential of the first electrode of T7 changes from the high level to the low level, T7 is opened, T8 is cut off, the potential of N4 is the low level, T11 is opened, and E1 outputs the high level; T1 ON, T10 OFF;

in a third time period P3, E1 and CB both provide a high level, CK provides a low level, T4 and T3 are opened, the potential of N1 is a high level, the potential of N2 is a low level, T2 and T5 are cut off, T6 and T9 are opened, the potential of the first electrode of T7 changes from the low level in the previous time period to the high level, T7 is cut off, the potential of N4 is maintained at the low level due to C3 discharging, T11 is opened, and E1 outputs the high level; T1 on, T8 and T10 off;

in a fourth time period P4, E1 and CB all provide a low level, CK provides a high level, T4 and T3 are cut off, the potential of N1 is a high level, T2 is cut off, the potential of N2 is maintained as a low level, T5, T6 and T9 are opened, the potential of the first electrode of T7 jumps to a low level, T7 is opened, the potential of N4 is a low level, T11 is opened, E1 outputs a high level, T1 is opened, and T8 and T10 are cut off;

in a fifth time period P5, E1 and CK both provide a low level, CB provides a high level, T4, T2, T3 and T1 are all open, the potential of N1 and the potential of N2 are both low levels, T5 is cut off, T6 and T9 are open, the potential of the first electrode of T7 becomes a high level, T7 is cut off, T8 is open, the potential of N4 becomes a high level, T11 is cut off, T10 is open, and E1 outputs a low level;

in a sixth time period P6, E1 and CB both provide a low level, CK provides a high level, T4 and T3 are cut off, the potential of N1 is maintained at the low level, T2 is opened, the potential of N2 is at the high level, T1, T5 and T6 are opened, T9 is cut off, the potential of the first electrode of T7 is at the high level, T7 and T8 are opened, the potential of N4 is at the high level, T11 is cut off, T10 is opened, and E1 outputs the low level;

in a seventh time period P7, E1 and CK both provide a low level, CB provides a high level, T4, T2, T3, T1 and T6 are all open, the potential of N1 and the potential of N2 are low levels, T9 is cut off, T6 and T9 are open, the potential of the first electrode of T7 is high levels, T7 is cut off, T8 is open, the potential of N4 is high levels, T11 is cut off, T10 is open, and the output of E1 is a low level;

in an eighth time period P8, E1 and CB both provide a low level, CK provides a high level, T4 and T3 are cut off, the potential of N1 is maintained at the low level, T2 is opened, the potential of N2 is at the high level, T5 is opened, T6 and T9 are cut off, the potential of the first electrode of T7 is maintained at the high level, T1, T7 and T8 are opened, the potential of N4 is at the high level, T11 is cut off, T10 is opened, and E1 outputs the low level;

after the seventh time period P7, T8 is continuously turned on, T11 is turned off, T1 periodically charges C2, the potential of N1 remains low, and T10 is continuously turned on, so that E1 outputs a low level until the next frame input signal pulse enters.

Figure 3:
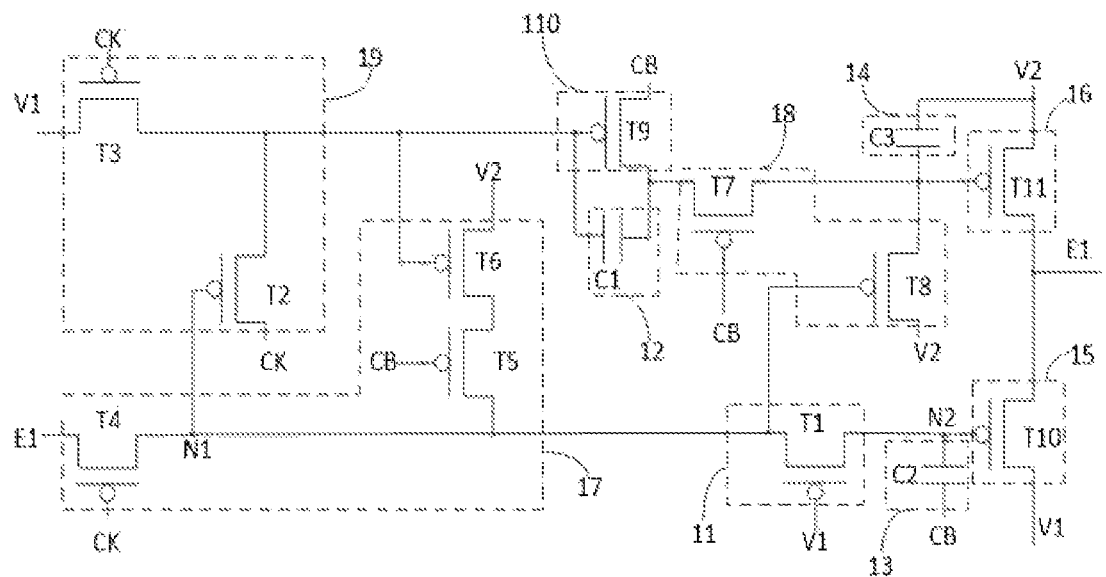
FIG. 3 is a circuit diagram of at least one embodiment of a shift register unit included in a display substrate according to an embodiment of the present disclosure.

FIG. 3 is a schematic diagram with the reference numerals for the electrodes of the transistors and the plates of the capacitors removed on the basis of FIG. 1 and showing the reference numerals of the circuits.

As shown in FIG. 3, at least one embodiment of the shift register unit comprises an on-off control circuit 11, a first energy storage circuit 12, a second energy storage circuit 13, a third energy storage circuit 14, a first output circuit 15, a second output circuit 16, a first node control circuit 17, a third node control circuit 18, a fourth node control circuit 19 and a fifth node control circuit 110.

Figure 4:
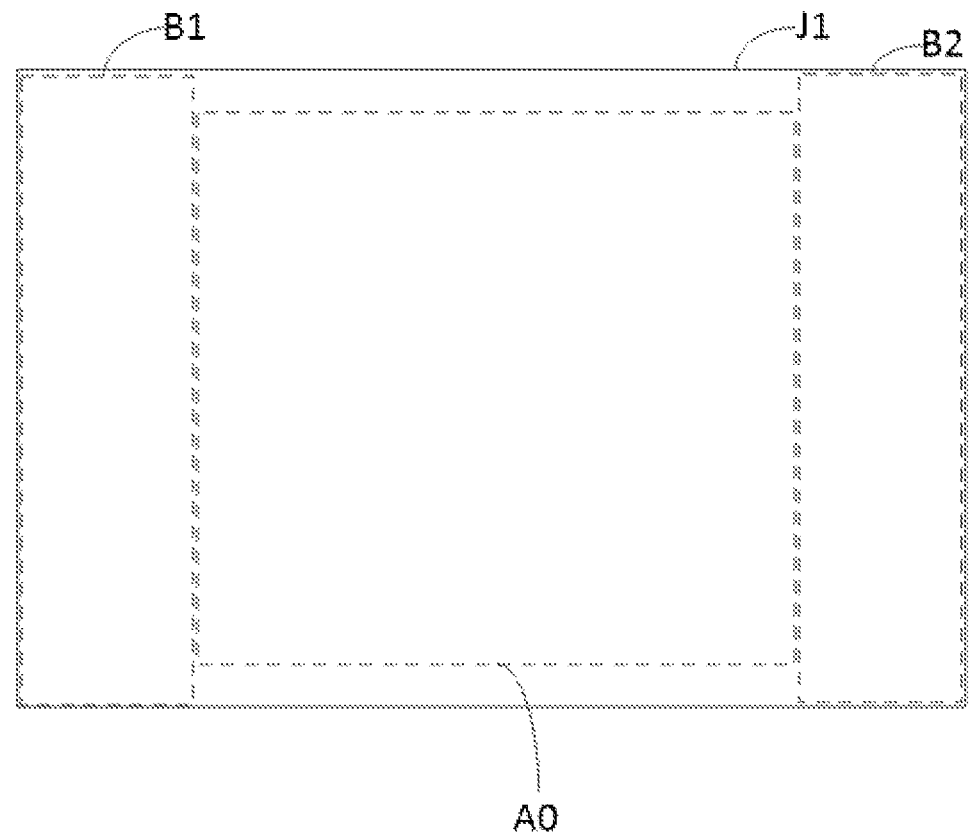
FIG. 4 is a schematic diagram of area division of a display substrate according to at least one embodiment of the present disclosure.

As shown in FIG. 4, the reference numeral J1 denotes a display substrate, the reference numeral A0 denotes a display area, the reference numeral B1 denotes a first edge area, and the reference numeral B2 denotes a second edge area.

A plurality of light-emitting control lines, a plurality of gate lines and a plurality of data lines, and a plurality of sub-pixels defined by the intersection of the plurality of gate lines and the plurality of data lines can be provided in the display area A0 of the display substrate J1;

a drive module may be provided in the first edge area B1 and/or the second edge area B2, wherein the drive module comprises a plurality of shift register units;

the signal output lines of each of the plurality of shift register units included in the drive module may be respectively coupled to A light-emitting control lines for providing light-emitting control signals for the corresponding light-emitting control lines.

Wherein A may be a positive integer. In actual operation, A may be equal to 1, 2, 3, 4 or other positive integers, and the value of A may be selected according to actual situations.

In particular implementations, the light emission control lines are coupled to light-emitting control ends of respective rows of pixel circuits.

Optionally, the display substrate further comprises a plurality of rows of pixel circuits arranged on the base; the pixel circuit comprises a light emission control end;

the shift register unit included in the drive module corresponds to at least one row of pixel circuits;

the signal output lines of the shift register units are coupled to the light-emitting control ends of the at least one row of pixel circuits for providing light-emitting control signals to the light-emitting control ends of the at least one row of pixel circuits.

In at least one embodiment of the present disclosure, the pixel circuit may be disposed in an active display area of a display substrate and the drive module may be disposed in an edge area of the display substrate.

Figure 5:
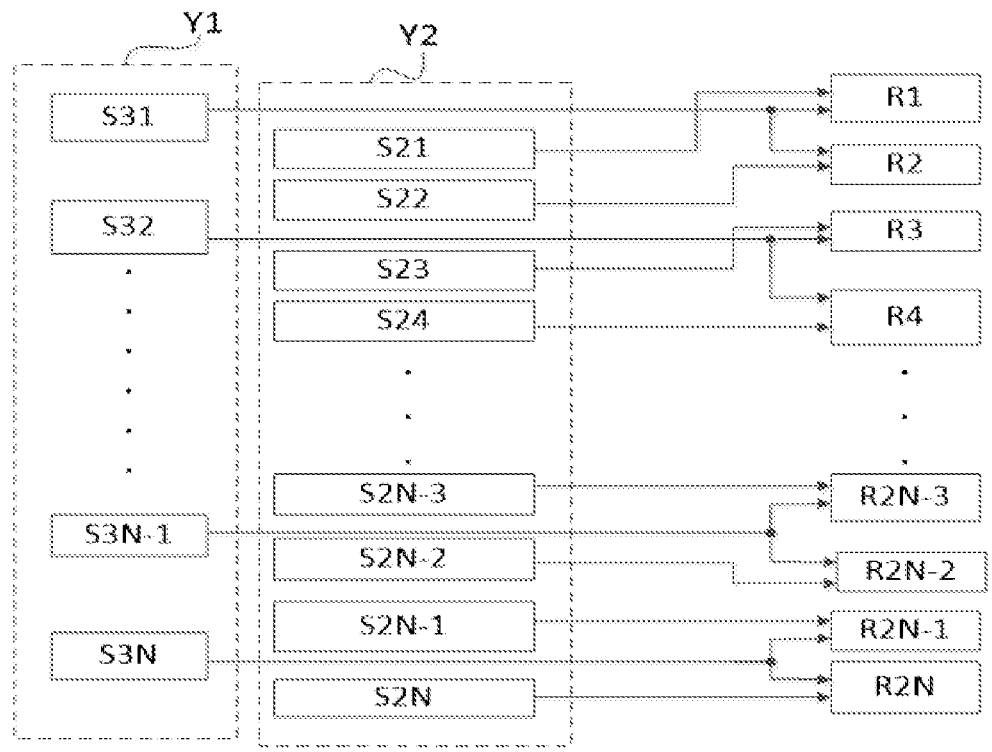
FIG. 5 is a schematic diagram illustrating a connection relationship between a shift register unit and a pixel circuit included in a display substrate according to at least one embodiment of the present disclosure.

As shown in FIG. 5, what is labeled Y1 is a drive module, what is labeled S31 is a first-stage shift register unit comprised by the drive module Y1, what is labeled S32 is a second-stage shift register unit comprised by the drive module Y1, what is labeled S3N−1 is an (N−1)th-stage shift register unit comprised by the drive module Y1, and the reference numeral S3N is an Nth-stage shift register unit comprised by the drive module Y1, wherein N is an integer greater than 3.

In FIG. 5, the reference numeral R1 denotes a first row of pixel circuits, the reference numeral R2 denotes a second row of pixel circuits, the reference numeral R3 denotes a third row of pixel circuits, the reference numeral R4 denotes a fourth row of pixel circuits, the reference numeral R2N−3 denotes a (2N−3)th row of pixel circuits, the reference numeral R2N−2 denotes a (2N−2)th row of pixel circuits, the reference numeral R2N−1 denotes a (2N−1)th row of pixel circuits, and the reference numeral R2N denotes a 2Nth row of pixel circuits;

S31 provides a light-emitting control signal for R1 and R2, S32 provides a light-emitting control signal for R3 and R4, S3N−1 provides a light-emitting control signal for R2N−3 and R2N−2, and S3N provides a light-emitting control signal for R2N−1 and R2N;

As shown in FIG. 5, in an edge area, the display substrate may further comprise a gate electrode driving circuit, wherein the gate electrode driving circuit comprises a multilevel gate electrode driving unit, and the gate electrode driving unit may correspond to a pixel row on a one-to-one basis for providing a corresponding gate driving signal for a corresponding row of pixels.

In FIG. 5, the reference numeral Y2 denotes a gate electrode driving circuit, the reference numeral S21 denotes a first row of gate electrode driving units included in the gate electrode driving circuit, the reference numeral S22 denotes a second row of gate electrode driving units included in the gate electrode driving circuit, the reference numeral S23 denotes a third row of gate electrode driving units included in the gate electrode driving circuit, the reference numeral S24 denotes a fourth row of gate electrode driving units included in the gate electrode driving circuit, the reference numeral S2N−3 denotes a (2N−3)th row of gate electrode driving units included in the gate electrode driving circuit, the reference numeral S2N−2 is a (2N−2)th row of gate electrode driving units included in the gate electrode driving circuit, the reference numeral S2N−1 is a (2N−1)th row of gate electrode driving units included in the gate electrode driving circuit, and the reference numeral S2N is a 2Nth row of gate electrode driving units included in the gate electrode driving circuit.

Figure 6:
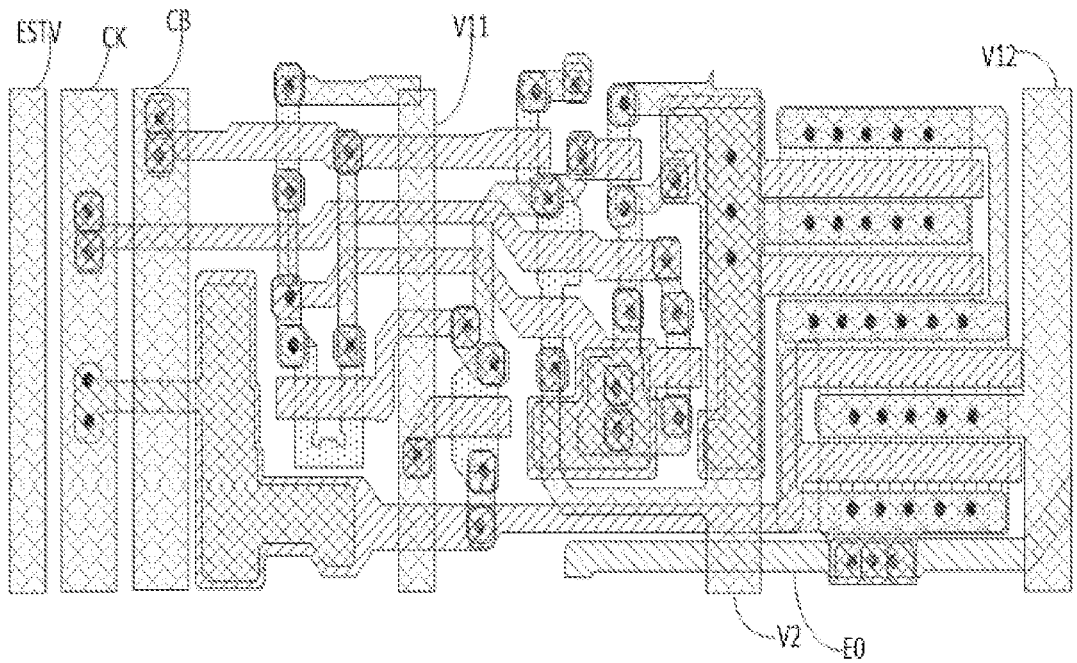
FIG. 6 is a schematic layout diagram of a shift register unit provided in at least one embodiment of the present disclosure.

As shown in FIG. 6, at least one embodiment of the shift register unit includes a first voltage line, a second voltage line, a first clock signal line CB, and a second clock signal line CK. The first voltage line comprises a first first voltage line V11 and a second first voltage line V12;

V12, V2, V11, CB and CK are arranged in a direction away from the display area, V11, V2, V11, CB and CK extending in a first direction.

As shown in FIGS. 1 and 6, at least one embodiment of the shift register unit switches off a control circuit, a first energy storage circuit and a fourth node control circuit; the on-off control circuit comprises a first transistor T1, and the first energy storage circuit comprises a first capacitor C1;

at least part of the first first voltage line V11 extends in a first direction;

the fourth node control circuit comprises a second transistor T2;

the first capacitor C1, the first transistor T1, the first first voltage line V11 and the second transistor T2 are arranged in a second direction; the second transistor T2, the first first voltage line V11, the first transistor T1 and the first capacitor C1 are arranged in sequence along the direction close to the display area;

the first direction intersects the second direction.

In at least one embodiment of the present disclosure, the first direction may be a vertical direction and the second direction may be a horizontal direction, but is not limited thereto.

In at least one embodiment of the shift register unit, the first transistor T1 is arranged between a first first voltage line V11 and a first capacitor C1, and the first capacitor C1, the first transistor T1, the first first voltage line V11 and a second transistor T2 are arranged in a second direction, so as to use a lateral space to arrange the first transistor T1, so as not to increase the vertical dimension occupied by the shift register unit, thereby being able to keep the original PPI (Pixel per inch) unchanged. T1 is added to ensure the stability of the output signal of the shift register unit, so as to achieve the purpose of improving the display performance.

In at least one embodiment of the present disclosure, as long as the vertical dimension occupied by the shift register unit is guaranteed to be constant, the size of the pixel circuit in the display area is guaranteed to be constant, thereby guaranteeing the original PPI.

Figure 7:
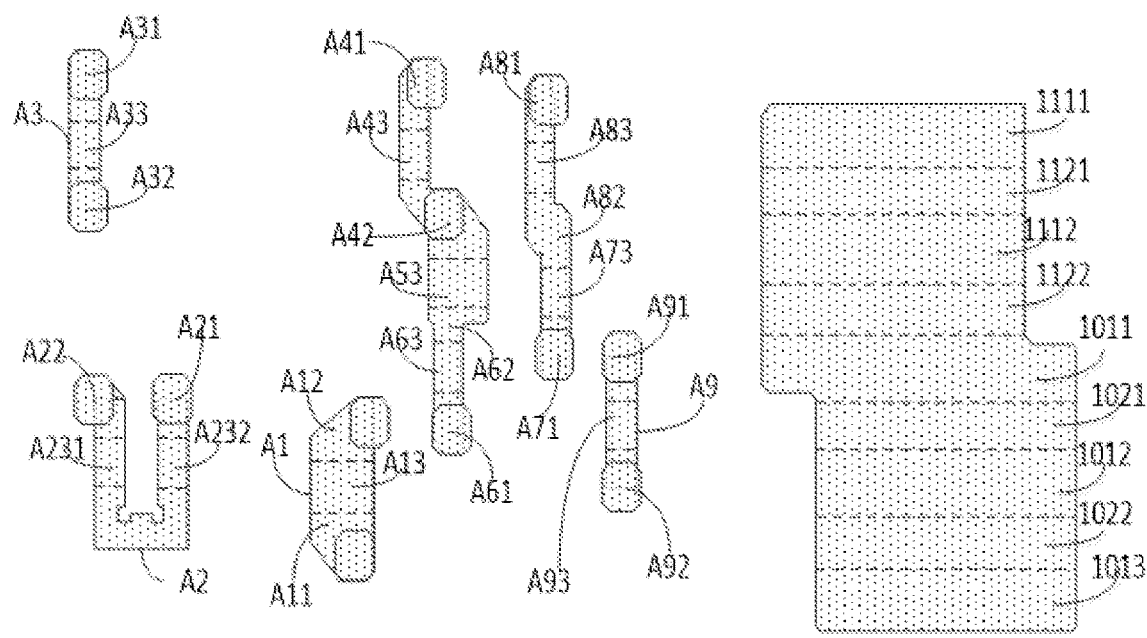
FIG. 7 is a schematic layout diagram of an active layer of FIG. 6.

As shown in FIG. 7, an active pattern denoted by A1 is T1, and A1 extends in a first direction; A1 comprises a first first conductive part A11, a first channel part A13 and a second first conductive part A12 which are successively arranged from bottom to top; A11 serves as a first electrode for T1 and A12 serves as a second electrode for T1.

Figure 8:
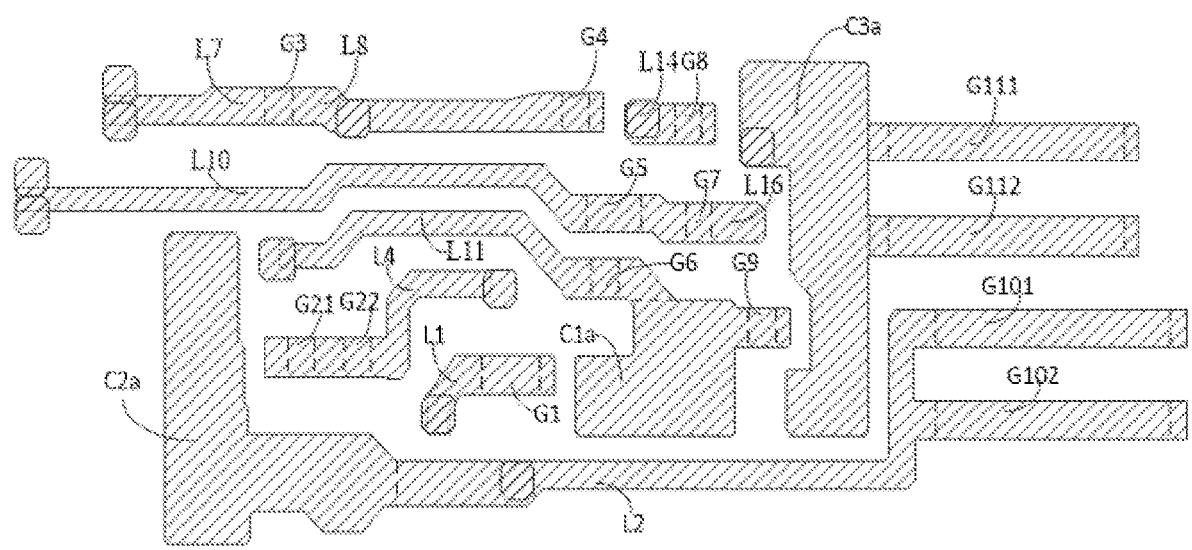
FIG. 8 is a schematic layout diagram of a first gate metal layer of FIG. 6.
Figure 9:
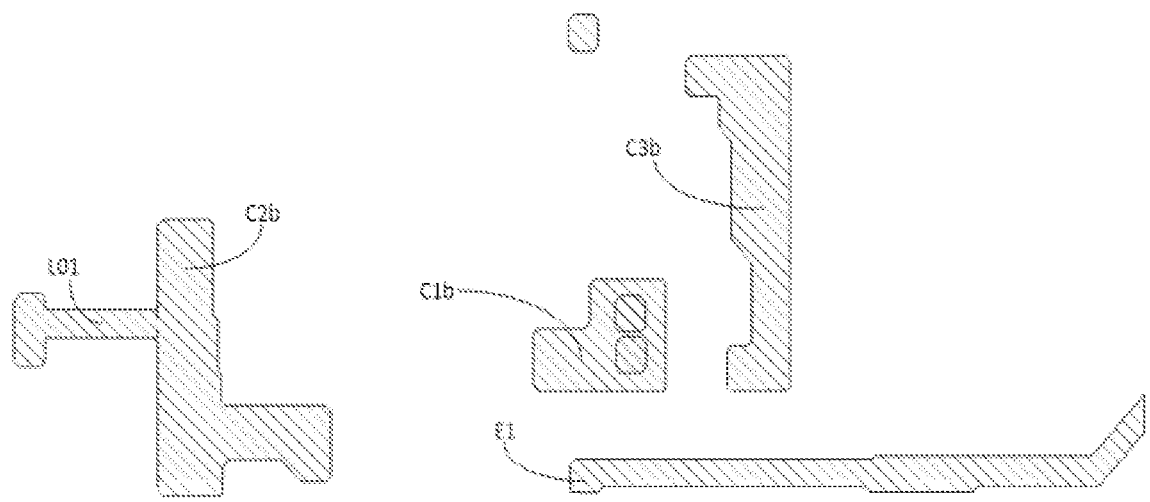
FIG. 9 is a schematic layout diagram of a second gate metal layer of FIG. 6.

In FIG. 8, the gate electrode of T1 is labeled G1, and the first plate of C1 is labeled C1a. In FIG. 9, the second plate labeled C1b is a second plate labeled C1, and in FIG. 11, the first first voltage line labeled V11 is a first first voltage line; V11 extends in a first direction.

As shown in FIGS. 6-11, the orthographic projection of the first plate C1a of C1 on the base, the orthographic projection of A11 on the base and the orthographic projection of V11 on the base are arranged along as first direction, and the first direction may be a horizontal direction; the orthographic projection of C1a on the base at least partially overlaps the orthographic projection of C1b on the base.

It can be seen from FIG. 6 that no transistor is provided above T1, so that on the basis of adding T1, the longitudinal dimension is not increased, and the original PPI is ensured to be unchanged.

Optionally, at least one of a transistor, a capacitor, and a signal line is not disposed between the first transistor and the first first voltage line such that the first transistor is proximate to the first first voltage line, facilitating coupling of the gate electrode of the first transistor to the first first voltage line.

In at least one embodiment of the present disclosure, as shown in FIG. 6, the first transistor T1 is in close proximity to the first first voltage line V11 to facilitate coupling the gate electrode of T1 to V11.

As shown in FIG. 7, the first transistor T1 comprises a first active pattern A1, at least part of the first active pattern A1 extending in a first direction;
- as shown in FIGS. 6-11, the gate electrode G1 of the first transistor T1 is located at a different layer from the first first voltage line V11; as shown in FIG. 8, the gate electrode G1 of the first transistor T1 is coupled to a first conductive connection portion L1, which is coupled to the first first voltage line V11 via a first via hole H1.

Optionally, as shown in FIGS. 1 and 6-11, the shift register unit further comprises a first clock signal line CB, a second clock signal line CK and a second energy storage circuit, the second energy storage circuit comprises a second capacitor C2, and the fourth node control circuit comprises a second transistor T2;
- the second capacitor C2 and the second transistor T2 are located on a side of the first first voltage line V11 away from the display area;
- the first clock signal line CB and the second clock signal line CK are located on a side of the second capacitor C2 away from the first first voltage line V11.

In at least one embodiment of the present disclosure, the second capacitor C2 and the second transistor T2 located on a side of the first first voltage line V11 away from the display area may be: an orthographic projection of the second capacitor C2 on the base and an orthographic projection of the second transistor T2 on the base are located on a side of the first first voltage line V11 on the base facing away from the display area;

The first clock signal line CB and the second clock signal line CK being located on the side of the second capacitor C2 away from the first first voltage line V11 may be: the orthographic projection of the first clock signal line CB onto the base and the orthographic projection of the second clock signal line CK onto the base are located on the side of the orthographic projection of the second capacitor C2 onto the base away from the orthographic projection of the first first voltage line V11 onto the base.

Figure 10:
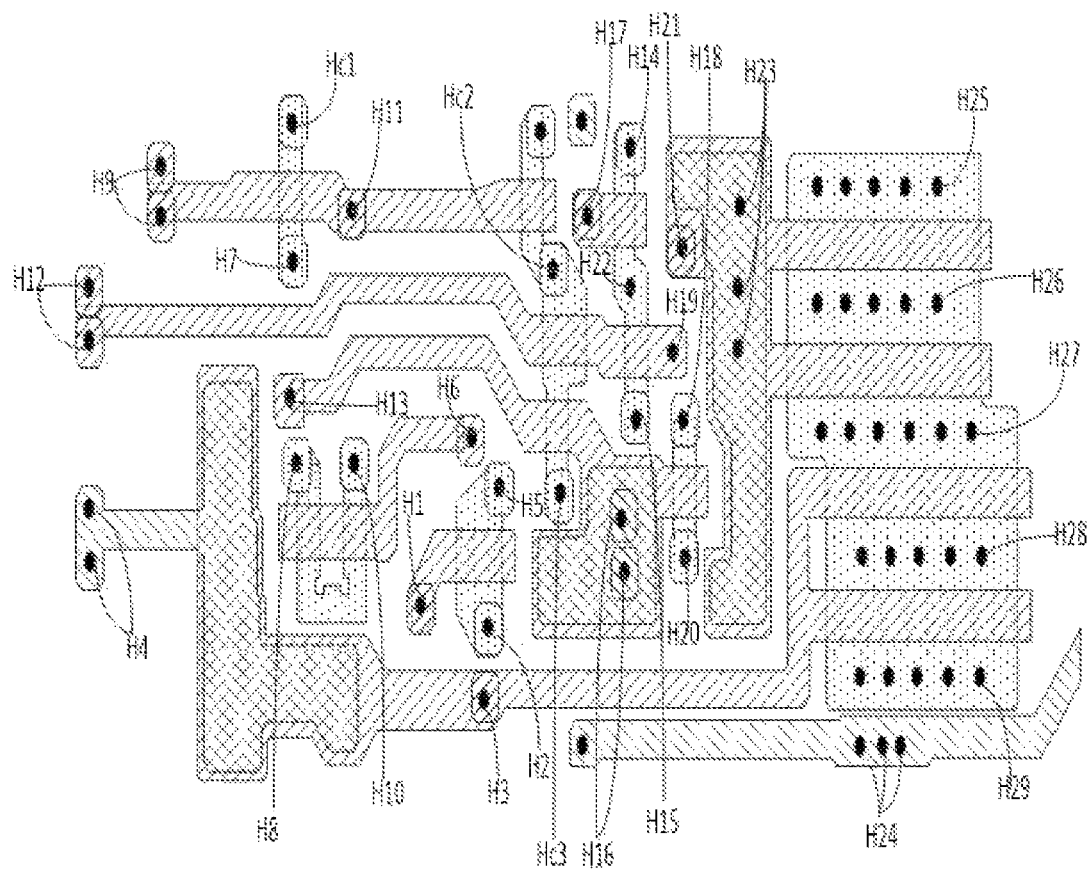
FIG. 10 is a schematic diagram of a via hole employed in FIG. 6.
Figure 11:
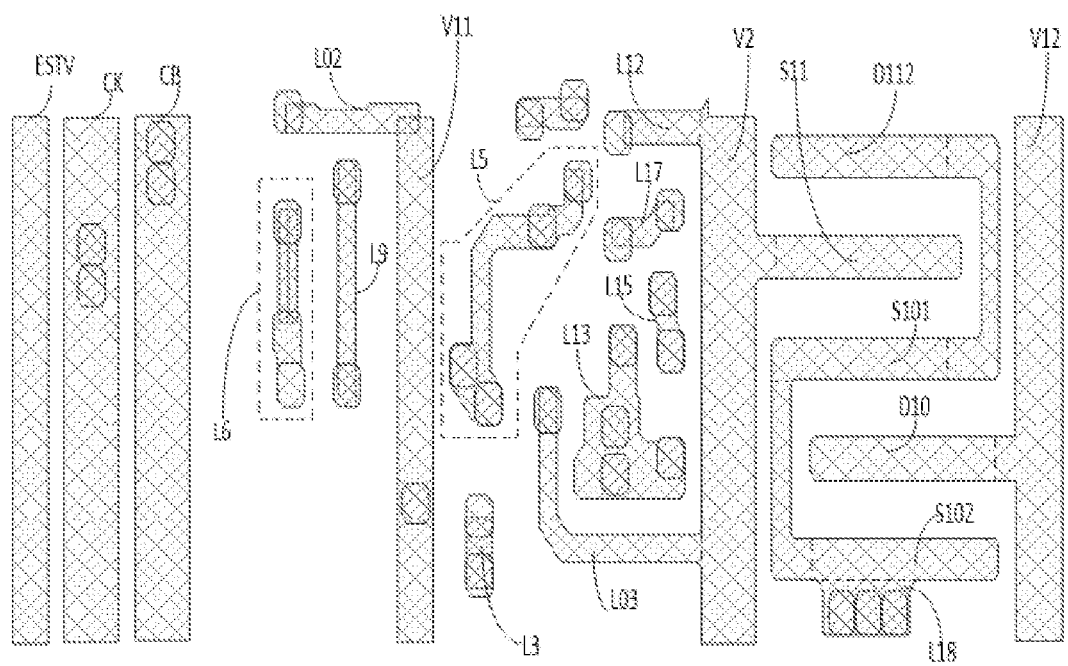
FIG. 11 is a schematic diagram of a source and drain metal layer of FIG. 6.

As shown in FIG. 11, both CB and CK extend in a first direction (which may be vertical). As shown in FIGS. 6-11, in at least one embodiment of the present disclosure, V11 is shifted to the right such that T2 and C2 are disposed between V11 and CB.

In at least one embodiment shown in FIGS. 6-11, V11 may be shifted to the right by about 8 um, and the lateral length of at least one embodiment of the shift register unit may be increased by 25 um, setting T1 through the extra lateral space.

In at least one embodiment shown in FIGS. 6-11, CB is disposed between CK and C2 to facilitate coupling of the second plate of C2 with CB. However, in practice, the positions of CB and CK may be interchanged.

As shown in FIGS. 6-11, T2 may be a double gate electrode transistor, a first gate electrode included in T2 is labeled G21, and a second gate electrode included in T2 is labeled G22, and G21 is coupled to G22.

In FIG. 8, the first plate labeled C2 is labeled C2a, the second plate labeled C2 is labeled C2b, and the orthographic projection of C2a on the base at least partially overlaps the orthographic projection of C2b on the base.

As shown in FIG. 8, the first plate C2a of the second capacitor is coupled to a second conductive connection portion L2; as shown in FIGS. 6-11, A11 (A11 serves as a first electrode of the first transistor) is electrically connected to a third conductive connection portion L3 via a second via hole H2, and the third conductive connection portion L3 is coupled to the second conductive connection portion L2 via a third via hole H3, so that A11 (A11 serves as a first electrode of the first transistor) is coupled to a first plate C2a of the second capacitor C2;

As shown in FIGS. 6-11, the second plate C2b of the second capacitor C2 is coupled to the first connecting conductive part L01, which is coupled to the first clock signal line CB through the fourth via hole H4 such that the second plate C2b of the second capacitor C2 is coupled to the first clock signal line CB.

In at least one embodiment of the present disclosure, "coupling" may include: be integrally formed; or electrically connected to each other through a via hole or a conductive connection portion; this is not intended to be limiting.

In at least one embodiment shown in FIG. 8, the first plate C2a of the second capacitor is integrally formed with the second conductive connection portion L2.

Alternatively, the orthographic projection of the second plate of the second capacitor on the base does not overlap with the orthographic projection of the first first voltage line on the base. In at least one embodiment of the present disclosure, the first first voltage line is moved from a position overlapping the second capacitor to a position adjacent the first transistor, and a lateral dimension of the at least one embodiment of the shift register unit is increased, the first transistor being disposed through the extra space.

As shown in FIG. 8, a first gate electrode G21 of the second transistor T2 and a second gate electrode G22 of the second transistor T2 are both coupled to a fourth conductive connection portion L4;

As shown in FIGS. 6-11, A12 (A12 serves as a second electrode of the first transistor T1) is coupled to a fifth conductive connection portion L5 through a fifth via hole H5; the fourth conductive connection portion LA is coupled to the fifth conductive connection portion L5 through a sixth via hole H6 such that the second electrode of the first transistor is coupled to G21 and G22.

In at least one embodiment shown in FIGS. 8, G21 and G22 are integrally formed.

Optionally, the fourth node control circuit further comprises a third transistor as shown in FIGS. 1 and 6; the third transistor T3 is arranged between the first clock signal line CB and the first first voltage line V11;

As shown in FIG. 7, T3 comprises a third active pattern A3, wherein the third active pattern A3 comprises a first third conductive part A31, a third channel part A33 and a second third conductive part A32 which are arranged in sequence from top to bottom;
- A31 serves as a first electrode of the third transistor T3, and A32 serves as a second electrode of the third transistor T3.

As shown in FIG. 7, the second transistor T2, a second active pattern A2, A2 comprising a first channel part A231, a second channel part A232, a first second conductive part A21 and a second second conductive part A22;

The orthographic projection of A231 on the base overlaps the orthographic projection of G21 on the base, and the orthographic projection of A232 on the base overlaps the orthographic projection of G22 on the base;

A21 serves as a first electrode for T2 and A22 serves as a second electrode for T2.

As shown in FIGS. 6-11, A31 (A31 serves as a first electrode of T3) is coupled to a second connecting conductive part L02 via a first connecting via hole Hc1, and the second connecting conductive part L02 is coupled to the first first voltage line V11, so that the first electrode of T3 is coupled to V11; A32 (A32 is used as a second electrode of T3) is coupled to a sixth conductive connection portion L6 via a seventh via hole H7; the sixth conductive connection portion L6 is coupled to A22 (serving as a second electrode of the second transistor T2) via an eighth via hole H8, so that the second electrode of the third transistor T3 is coupled to the second electrode of the second transistor T2;

As shown in FIGS. 6-11, the gate electrode G3 of the third transistor T3 is coupled to a seventh conductive connection portion L7 and an eighth conductive connection portion L8, and the seventh conductive connection portion L7 is coupled to the second clock signal line CK via a ninth via hole H9, so that the gate electrode G3 of the third transistor T3 is coupled to the CK;

As shown in FIGS. 6-11, A21 (serving as the first electrode of the second transistor) is coupled to a ninth conductive connection portion L9 through a tenth via hole H10, which is coupled to the eighth conductive connection portion L8 through an eleventh via hole H11, such that the first electrode of the second transistor T2 is coupled to the gate electrode G3 of the third transistor T3.

In at least one embodiment shown in FIGS. 8, G3, L7, and L8 are integrally formed.

In at least one embodiment of the present disclosure, as shown in FIGS. 6-11, T3 and T2 are aligned along a first direction, T3 includes a third active pattern A3 extending along the first direction, T2 includes a second active pattern A2 that is U-shaped, and C2 includes a plate that is L-shaped. T2, T3 and C2 are set between CK and V11.

Optionally, the shift register unit further comprises a second voltage line and a first node control circuit; the second voltage line V2 is located on one side of the first first voltage line V11 near the display area; as shown in FIGS. 1 and 6, the first node control circuit comprises a fourth transistor T4, a fifth transistor T5 and a sixth transistor T6; the fourth transistor T4, the fifth transistor T5 and the sixth transistor T6 are arranged between the first first voltage line V11 and the second voltage line V2;

As shown in FIG. 7, the fourth transistor T4 comprises a fourth active pattern, the fifth transistor T5 comprises a fifth active pattern, and the sixth transistor T6 comprises a sixth active pattern; the fourth active pattern, the fifth active pattern and the sixth active pattern are integrally formed;

The fourth active pattern comprises a first fourth conductive part A41, a fourth channel part A43 and a second fourth conductive part A42 which are successively arranged along the first direction; the first fourth conductive part A41 is a first end of the fourth active pattern; the second fourth conductive part A42 is a second end of the fourth active pattern;

the fifth active pattern comprises a second fifth conductive part, a fifth channel part A53 and a first fifth conductive part successively arranged in a first direction; the second fifth conductive part is a first end of the fifth active pattern; the second fifth conductive part is a second end of the fifth active pattern;

the sixth active pattern comprises a second sixth conductive part A62, a sixth channel part A63 and a first sixth conductive part A61 which are successively arranged in a first direction; A second sixth conductive part A62 is a second end of the sixth active pattern, and the first first conductive part A61 is a first end of the sixth active pattern;

the second fourth conductive part A42 is multiplexed into the second fifth conductive part, and the first fifth conductive part is multiplexed into the second sixth conductive part A62; the first fourth conductive part A41 serves as a first electrode of the fourth transistor T4, the second fourth conductive part A42 serves as a second electrode of the fourth transistor T4, the first fifth conductive part A51 serves as a first electrode of the fifth transistor T5, and the second fifth conductive part A52 serves as a second electrode of the fifth transistor T5; the first sixth conductive part A61 serves as a first electrode of the sixth transistor T6, and the second sixth conductive part A62 serves as a second electrode of the sixth transistor T6.

A42 is coupled with the fifth conductive connection portion L5 via the second connection via hole Hc2, so that A42 is coupled with A12, so that the second electrode of the fourth transistor T4 is coupled with the second electrode of the first transistor T1;

The first sixth conductive part A61 is coupled to a third connecting conductive part L03 through a third connecting via hole Hc3, and the third connecting conductive part L03 is coupled to a second voltage line V2, so that A61 is coupled to V2 and thus a first electrode of a sixth transistor T6 is coupled to V2.

In at least one embodiment shown in FIG. 11, V2 is integrally formed with L03.

In at least one embodiment shown in FIGS. 6-11, A41 may be coupled to a signal output line of an adjacent previous level shift register unit through a via hole.

In FIGS. 6-11, a start signal line is designated ESTV, and a first electrode of a fourth transistor in a first one of the shift register units is coupled to the start signal line ESTV.

In at least one embodiment of the present disclosure, the second voltage line V2 located on the side of the first first voltage line V11 near the display area may be: an orthographic projection of the second voltage line V2 on the base, located at one side of the orthographic projection of the first first voltage line V11 on the base close to the display area;

The fourth transistor T4, the fifth transistor T5 and the sixth transistor T6 provided between the first first voltage line V11 and the second voltage line V2 may refer to: the orthographic projection of the fourth transistor T4 on the base, the orthographic projection of the fifth transistor T5 on the base and the orthographic projection of the sixth transistor T6 on the base are arranged between the orthographic projection of the first first voltage line V11 on the base and the orthographic projection of the second voltage line V2 on the base.

As shown in FIGS. 7, A4, A5 and A6 are formed by a continuous semiconductor layer, and at least part of A4 extends in a first direction (the first direction may be a vertical direction), at least part of A5 extends in the first direction, at least part of A6 extends in the first direction, the orthographic projection of A4 on the base, the orthographic projection of A5 on the base and the orthographic projection of A6 on the base are located above the orthographic projection of the first plate of C1 on the base, and A1 is not provided with the orthographic projection of A4 on the base above the orthographic projection on the base, the orthographic projection of A5 on the base and the orthographic projection of A6 on the base are such as to ensure that the vertical dimension occupied by at least one embodiment of the shift register unit is not increased by the addition of T1.

As shown in FIGS. 1, 6-11, the fourth node control circuit further comprises a third transistor T3; the fourth transistor T4 is located at one side of the first first voltage line V11 away from the third transistor T3; the gate electrodes of the third transistor T3 are respectively coupled to a seventh conductive connection portion L7 and an eighth conductive connection portion L8, the seventh conductive connection portion L7 is coupled to the second clock signal line CK through a via hole, and the eighth conductive connection portion L8 is coupled to the gate electrode G4 of the fourth transistor T4, so that the gate electrode G4 of the fourth transistor T4 is coupled to the second clock signal line CK;

As shown in FIGS. 6-11, the gate electrode G5 of the fifth transistor T5 is coupled to a tenth conductive connection portion L10, and the tenth conductive connection portion L10 is coupled to the first clock signal line CB via a twelfth via hole H12, so that the gate electrode G5 of the fifth transistor T5 is coupled to the first clock signal line CB;

A32 (A32 serves as the second electrode of the third transistor T2) is coupled to a sixth conductive connection portion L6 through a seventh via hole H7, a gate electrode G6 of the sixth transistor T6 is coupled to an eleventh conductive connection portion L11, and the eleventh conductive connection portion L11 is coupled to the sixth conductive connection portion L6 through a thirteenth via hole H13, so that the gate electrode G6 of the sixth transistor T6 is coupled to A32 (A32 serves as the second electrode of the third transistor).

In at least one embodiment shown in FIG. 8, L8 is integrally formed with G4, G5 is integrally formed with L10, and G6 is integrally formed with L11.

In at least one embodiment of the present disclosure, the fourth transistor T4 located on the side of the first first voltage line V11 away from the third transistor T3 may be: the orthographic projection of the fourth transistor T4 on the base is located on the side of the orthographic projection of the first first voltage line V11 on the base away from the orthographic projection of the third transistor T3 on the base.

As shown in FIGS. 1, 6-11, the shift register unit further comprises a third node control circuit; the first energy storage circuit comprises a first capacitor C1; the third node control circuit comprises a seventh transistor T7 and an eighth transistor T8; the eighth transistor T8 and the seventh transistor T7 are provided between the first first voltage line V11 and the second voltage line V2;

As shown in FIG. 7, the seventh transistor T7 comprises a seventh active pattern A7, and the eighth transistor T8 comprises an eighth active pattern A8; the seventh active pattern A7 and the eighth active pattern A8 are integrally formed;

the eighth active pattern A8 comprises a first eighth conductive part A81, an eighth channel part A83 and a second eighth conductive part A82 arranged successively along a first direction; the first eighth conductive part A81 is a first end of the eighth active pattern A8, and the second eighth conductive part A82 is a second end of the eighth active pattern A8;

the seventh active pattern A7 comprises a second seventh conductive part, a seventh channel part A73 and a first seventh conductive part A71 arranged successively along a first direction; the second seventh conductive part is a second end of the seventh active pattern A7, and the first seventh conductive part A71 is a first end of the seventh active pattern A7;

the second seventh conductive part is multiplexed into a second eighth conductive part A82;

The first eighth conductive part A81 serves as a first electrode of the eighth transistor T8, and the second eighth conductive part A82 serves as a second electrode of the eighth transistor T8; the first seventh conductive part A71 serves as a first electrode of the seventh transistor T7, and the second seventh conductive part A72 serves as a second electrode of the seventh transistor T7;

As shown in FIGS. 6-11, the first eighth conductive part A81 is coupled to a twelfth conductive connection portion L12 via a fourteenth via hole H14, and the twelfth conductive connection portion L12 is coupled to the second voltage line V2, so that the first eighth conductive part A81 is coupled to the second voltage line V2;

the first seventh conductive part A71 is coupled to a thirteenth conductive connection portion L13 via a fifteenth via hole H15, and the thirteenth conductive connection portion L13 is coupled to a second plate C1b of the first capacitor C1 via a sixteenth via hole H16, so that the first seventh conductive part A71 is coupled to the second plate C1b of the first capacitor C1;

The first plate C1a of the first capacitor C1 is coupled to the gate electrode G6 of the sixth transistor T6;

The gate electrode G8 of the eighth transistor T8 is coupled to a fourteenth conductive connection portion L14, the fourteenth conductive connection portion L14 is coupled to a fifth conductive connection portion L5 via a seventeenth via hole H17, and the fifth conductive connection portion L5 is coupled to the second electrode of the first transistor T1 via a fifth via hole H5, so that the gate electrode G8 of the eighth transistor T8 is coupled to the second electrode of the first transistor T1;

As shown in FIG. 8, the gate electrode G7 of the seventh transistor T7 is coupled to the gate electrode G5 of the fifth transistor T5.

In at least one embodiment shown in FIGS. 6-11, V2 is integrally formed with L12, C1a is integrally formed with G6 and G9, G8 is integrally formed with L14, and G7 is integrally formed with G5.

In at least one embodiment of the present disclosure, A7 and A8 are formed from a continuous semiconductor layer, and at least part of A7 extends in a first direction (which may be a vertical direction), at least part of A8 extends in the first direction, the orthographic projection of A7 on the base and the orthographic projection of A8 on the base are located above the orthographic projection of the first plate of C1 on the base, and A1 is not provided with the orthographic projection of A7 on the base and the orthographic projection of A8 on the base above the orthographic projection on the base, in order to be able to ensure that the vertical size occupied by at least one embodiment of the shift register unit is not increased by the addition of T1.

In at least one embodiment of the present disclosure, the arrangement of the eighth transistor T8 and the seventh transistor T7 between the first first voltage line V11 and the second voltage line V2 may be: the orthographic projection of the eighth transistor T8 on the base and the orthographic projection of the seventh transistor T7 on the base are arranged between the orthographic projection of the first first voltage line V11 on the base and the orthographic projection of the second voltage line V2 on the base.

Optionally, as shown in FIGS. 1, 6-11, the shift register unit further comprises a fifth node control circuit; the fifth node control circuit comprises a ninth transistor T9;

As shown in FIG. 7, the ninth transistor T9 comprises a ninth active pattern A9, at least part of the ninth active pattern A9 extending in a first direction;

As shown in FIGS. 6-11, the ninth transistor T9 is located between the first capacitor C1 and the second voltage line V2;

The gate electrode G9 of the ninth transistor T9 is coupled to a first plate C1a of the first capacitor C1;

the ninth active pattern A9 comprises a first ninth conductive part A91, a ninth channel part A93 and a second ninth conductive part A92 arranged in sequence along a first direction; the first ninth conductive part A91 is a first end of the ninth active pattern A9, and the second ninth conductive part A92 is a second end of the ninth active pattern A9;

The first ninth conductive part A91 serves as a first electrode of the ninth transistor T9, and the second ninth conductive part A92 serves as a second electrode of the ninth transistor T9;

the first ninth conductive part A91 is coupled to a fifteenth conductive connection portion L15 via an eighteenth via hole H18, the gate electrode G7 of the seventh transistor T7 is coupled to a sixteenth conductive connection portion L16, and the fifteenth conductive connection portion L15 is coupled to the sixteenth conductive connection portion L16 via a nineteenth via hole H19, so that the first ninth conductive part A91 is coupled to the gate electrode G7 of the seventh transistor T7; the second ninth conductive part A92 is coupled to the thirteenth conductive connection portion L13 through a twentieth via hole H20 such that the second ninth conductive part A92 is coupled to the second plate C1b of the first capacitor C1.

In at least one embodiment shown in FIGS. 6-11, G9 is integrally formed with C1a and G7 is integrally formed with L16.

In at least one embodiment of the present disclosure, T9 may be disposed between C1 and V2.

In at least one embodiment of the present disclosure, the ninth transistor T9 located between the first capacitor C1 and the second voltage line V2 may be: the orthographic projection of the ninth transistor T9 on the base is located between the orthographic projection of the first capacitor C1 on the base and the orthographic projection of the second voltage line V2 on the base.

Optionally, as shown in FIGS. 1, 6-11, the shift register unit further comprises a third energy storage circuit, the third energy storage circuit comprising a third capacitor C3;

An orthographic projection of a first plate C3a of the third capacitor C3 on the base, an orthographic projection of a second plate C3b of the third capacitor C3 on the base at least partially overlapping with an orthographic projection of the second voltage line V2 on the base;

The first plate C3a of the third capacitor C3 is coupled to a seventeenth conductive connection portion L17 via a twenty-first via hole H21, and the seventeenth conductive connection portion L17 is coupled to a second eighth conductive part A82 via a twenty-second via hole H22, so that the first plate C3a of the third capacitor C3 is coupled to the second eighth conductive part A82;

The second plate C3b of the third capacitor C3 is coupled to the second voltage line V2 via a twenty-third via hole H23.

In a particular implementation, the orthographic projection of the plate of the third capacitor C3 on the base overlaps at least partially with the orthographic projection of the second voltage line V2 on the base to save occupied lateral space.

In at least one embodiment of the present disclosure, as shown in FIGS. 1, 6-11, the shift register unit further includes a first output circuit, a second output circuit, and a second first voltage line V12. The first output circuit comprises a first output transistor T10, and the second output circuit comprises a second output transistor T11; the first output transistor T10 and the second output transistor T11 are located between the second voltage line V2 and a second first voltage line V12 located at a side of the second voltage line V2 near the display area.

In an embodiment, the first output transistor and the second output transistor are arranged between a second voltage line V2 and a second first voltage line V12, and V12 is disposed at a side of V2 near the display area.

In at least one embodiment of the present disclosure, the location of the first output transistor T10 and the second output transistor T11 between the second voltage line V2 and the second first voltage line V12 may refer to: the orthographic projection of the first output transistor T10 on the base and the orthographic projection of the second output transistor T11 on the base are located between the orthographic projection of the second voltage line V2 on the base and the orthographic projection of the second first voltage line V12 on the base;

The second first voltage line V12 located on the side of the second voltage line V2 near the display area may be: the orthographic projection of the second first voltage line V12 on the base is located at the side of the orthographic projection of the second voltage line V2 on the base near the display area.

Optionally, as shown in FIGS. 1, 6-11, the shift register unit further comprises a signal output line E1, a second energy storage circuit and a third energy storage circuit; the second energy storage circuit comprises a second capacitor C2, and the third energy storage circuit comprises a third capacitor C3; the first plate C2b of the second capacitor C2 is coupled to the second conductive connection portion L2;

the active layer of the first output transistor T10 and the active layer of the second output transistor T11 are formed by one continuous semiconductor layer extending in a first direction;

a first electrode of the first output transistor T10 is coupled to a second electrode of the second output transistor T11, the first electrode of the first output transistor T10 is coupled to an eighteenth conductive connection portion L18, and the eighteenth conductive connection portion L18 is coupled to the signal output line E1 via a twenty-fourth via hole H24;

a second electrode D10 of the first output transistor T10 is coupled to the second first voltage line V12;

a first electrode S11 of the second output transistor T11 is coupled to the second voltage line V2;

the gate electrode of the first output transistor T10 is coupled to the second conductive connection portion L2, and the gate electrode of the second output transistor T11 is coupled to the first plate C3a of the third capacitor C3.

In at least one embodiment shown in FIGS. 6-11, the first electrode of T10 is integrally formed with the second electrode of T11, L18 is integrally formed with the first electrode of T10, D10 is integrally formed with V12, S11 is integrally formed with V2, the gate electrode of T10 is integrally formed with L2, and the gate electrode of T11 is integrally formed with C3a.

In at least one embodiment of the present disclosure, a first output transistor T10 and a second output transistor T11 are disposed between a second voltage line V2 and a second first voltage line V12, facilitating coupling of the second electrode of T10 to V12 and facilitating coupling of the first electrode of T11 to V2.

As shown in FIGS. 6-11, V12 is disposed on the side of V2 near the display area.

As shown in FIGS. 6 and 8, in at least one embodiment of the present disclosure, the gate electrode of T10 may include a first first output gate pattern G101 and a second first output gate pattern G102; the gate of T11 includes a first second output gate pattern G111 and a second second output gate pattern G112;

G111, G112, G101 and G102 are arranged in sequence along the first direction;

G111, G112, G101, and G102 all extend in the second direction;

G101 and G102 are coupled to each other, and G111 and G112 are coupled to each other.

The second electrode of the second output transistor T11 comprises a first second electrode pattern D112; the first electrode of the first output transistor T10 comprises a first first electrode pattern S101 and a second first electrode pattern S102 which are coupled to each other;

S101 is multiplexed into a second second electrode pattern comprised by the second electrode of the second output transistor T11, such that the first electrode of T10 is coupled to the second electrode of T11.

In at least one embodiment shown in FIGS. 6-11, G101 is integrally formed with G102, G111 is integrally formed with G112, and D112, S101, and S102 are integrally formed.

In particular implementations, the active layer of the first output transistor may include at least two first output conductive parts and at least one first output channel part oppositely disposed along a first direction; each of the first output channel parts is arranged between two adjacent first output conductive parts;

the first output channel parts are in one-to-one correspondence with the first output gate electrode patterns, and each orthographic projection of the first output channel parts on the base is within the corresponding orthographic projection of the first output gate electrode patterns on the base.

As shown in FIG. 7, the reference numeral 1011 is a first first output conductive part, the reference numeral 1012 is a second first output conductive part, the reference numeral 1013 is a third first output conductive part, the reference numeral 1021 is a first output channel part, and the reference numeral 1022 is a second output channel part;

the reference numeral 1111 is a first second output conductive part, the reference numeral 1112 is a second output conductive part, the reference numeral 1121 is a first second output channel part, and the reference numeral 1122 is a second second channel part.

As shown in FIGS. 6-11, D112 is coupled to the first second output conductive part 1111 through the twenty-fifth via hole H25, S11 is coupled to the second second output conductive part 1112 through the twenty-sixth via hole H26, S101 is coupled to the first first output conductive part 1011 through the twenty-seventh via hole H27, D10 is coupled to the second first output conductive part 1012 through the twenty-eighth via hole H28, and S102 is coupled to the third first output conductive part 1013 through the twenty-ninth via hole H29.

In at least one embodiment of the present disclosure, as shown in FIGS. 1 and 6-11, the shift register unit comprises a first first voltage line V11, a second first voltage line V12, a second voltage line V2, a first clock signal line CB, a second clock signal line CK, a signal output line E1, a first capacitor C1, a second capacitor C2, a third capacitor C3, a first transistor T1, a second transistor T2, a third transistor T3, a fourth transistor T4, a fifth transistor T5, a sixth transistor T6, a seventh transistor T7 and an eighth transistor T8, a ninth transistor T9, a first output transistor T10 and a second output transistor T11;

a gate electrode G1 of the first transistor T1 is coupled to the first first voltage line V11, a first electrode of the first transistor T1 is coupled to a first plate C2a of the second capacitor C2, and a second electrode of the first transistor T1 is coupled to a gate electrode G2 of the second transistor T2;

a gate electrode G2 of the second transistor T2 is coupled to a second electrode of the first transistor T1;

a second plate C2b of the second capacitor C2 is coupled to the first clock signal line CB;

a first electrode of the third transistor T3 is coupled to the first first voltage line V11, and a second electrode of the third transistor T3 is coupled to a second electrode D2 of the second transistor T2;

a gate electrode G3 of the third transistor T3 is coupled to a first electrode of the second transistor T2;

a gate electrode G4 of the fourth transistor T4 is coupled to the second clock signal line CB; the second electrode of the fourth transistor T4 is coupled to the second electrode of the fifth transistor T5; a first electrode of the fifth transistor T5 is coupled to a second electrode of the sixth transistor T6; a first electrode of the sixth transistor T6 is coupled to the second voltage line V2;

a gate electrode G5 of the fifth transistor T5 is coupled to the first clock signal line CB, and a second electrode of the third transistor T3 is coupled to a gate electrode G6 of the sixth transistor T6;

a first electrode of the eighth transistor T8 is coupled to the second voltage line V2, a first electrode of the seventh transistor T7 is coupled to a second plate C1b of the first capacitor C1, and a first plate C1a of the first capacitor C1 is coupled to a gate electrode G6 of the sixth transistor T6; the second electrode of the seventh transistor T7 is coupled to the second electrode of the eighth transistor T8;

a gate electrode G8 of the eighth transistor T8 is coupled to the second electrode of the first transistor T1, and the gate electrode G7 of the seventh transistor T7 is coupled to the gate electrode G5 of the fifth transistor T5;

a first electrode of the ninth transistor T9 is coupled to a gate electrode G7 of the seventh transistor T7, and a second electrode of the ninth transistor T9 is coupled to a second plate C1b of the first capacitor C1; A gate electrode G9 of the ninth transistor T9 is coupled to a first plate C1b of the first capacitor C1;

a first plate C3a of the third capacitor C3 is coupled to a second electrode of the eighth transistor T8, and a second plate C3b of the third capacitor C3 is coupled to the second voltage line V2;

a first electrode of the first output transistor T10 is coupled to a second electrode of the second output transistor T11, a second electrode of the second output transistor T11 is coupled to the signal output line E1, a second electrode D10 of the first output transistor T10 is coupled to the second first voltage line V12, and a first electrode S11 of the second output transistor T11 is coupled to the second voltage line V2; the gate electrode of the first output transistor T10 is coupled to a first electrode of the first transistor T1, and a gate electrode of the second output transistor T11 is coupled to a first plate C3b of the third capacitor C3;

an orthographic projection of the first plate C3a of the third capacitor C3 on the base, the orthographic projection of the second plate C3b of the third capacitor C3 on the base and the orthographic projection of the second voltage line V2 on the base at least partly overlap.

As shown in FIGS. 6-11, the first transistor T1, the fourth transistor T4, the fifth transistor T5, the sixth transistor T6, the seventh transistor T7, the eighth transistor T8, the ninth transistor T9 and the first capacitor C1 are arranged between the first first voltage line V11 and the second voltage line V2, and the second transistor T2, the third transistor T3 and the second capacitor C2 are arranged between the first second voltage line V12 and a first clock signal line CB;

the first clock signal line CB and the second clock signal line CK are arranged on one side of the first first voltage line V11 away from the second voltage line V2;

the first output transistor T10 and the second output transistor T11 are arranged between the second voltage line V2 and the second first voltage line V12; the second first voltage line V12 is provided on a side of the second voltage line V2 away from the first first voltage line V11.

As shown in FIGS. 6-11, the fourth transistor T4, the fifth transistor T5 and the sixth transistor T6 are arranged in sequence along a first direction;

the eighth transistor T8, the seventh transistor T7 and the first capacitor C1 are arranged in sequence along a first direction;

the eighth transistor T8, the fourth transistor T4 and the third transistor T3 are arranged in sequence along a second direction;

the first capacitor C1, the first transistor T1 and the second transistor T2 are arranged in sequence along a second direction;

at least part of the first clock signal line CB, at least part of the second clock signal line CK, at least part of the first first voltage line V11, at least part of the second first voltage line V12 and at least part of the second voltage line V2 extend in a first direction.

In at least one embodiment of the present disclosure, the arrangement of the first transistor T1, the fourth transistor T4, the fifth transistor T5, the sixth transistor T6, the seventh transistor T7, the eighth transistor T8, the ninth transistor T9 and the first capacitor C1 between the first first voltage line V11 and the second voltage line V2 may refer to: an orthographic projection of the first transistor T1 on the base, an orthographic projection of the fourth transistor T4 on the base, an orthographic projection of the fifth transistor T5 on the base, an orthographic projection of the sixth transistor T6 on the base, an orthographic projection of the seventh transistor T7 on the base, an orthographic projection of the eighth transistor T8 on the base, an orthographic projection of the ninth transistor T9 on the base and an orthographic projection of the first capacitor C1 on the base, arranged between the orthographic projection of the first first voltage line V11 on the base and the orthographic projection of the second voltage line V2 on the base;

the second transistor T2, the third transistor T3 and the second capacitor C2 between the first second voltage line V12 and the first clock signal line CB may be: the orthographic projection of the second transistor T2 on the base, the orthographic projection of the third transistor T3 on the base and the orthographic projection of the second capacitor C2 on the base are arranged between the orthographic projection of the first second voltage line V12 on the base and the orthographic projection of the first clock signal line CB on the base;

the first clock signal line CB and the second clock signal line CK being provided on the side of the first first voltage line V11 away from the second voltage line V2 may refer to: the orthographic projection of the first clock signal line CB on the base and the orthographic projection of the second clock signal line CK on the base are arranged on one side of the orthographic projection of the first first voltage line V11 on the base away from the orthographic projection of the second voltage line V2 on the base;

the arrangement of the first output transistor T10 and the second output transistor T11 between the second voltage line V2 and the second first voltage line V12 may be: the orthographic projection of the first output transistor T10 on the base and the orthographic projection of the second output transistor T11 on the base are arranged between the orthographic projection of the second voltage line V2 on the base and the orthographic projection of the second first voltage line V12 on the base;

the second first voltage line V12 provided on the side of the second voltage line V2 away from the first first voltage line V11 may be: the orthographic projection of the second first voltage line V12 on the base is arranged on the side of the orthographic projection of the second voltage line V2 on the base away from the orthographic projection of the first first voltage line V11 on the base.

Optionally, the display substrate of at least one embodiment of the present disclosure may further comprise a plurality of rows of pixel circuits disposed on the display area of the base, the pixel circuits comprising light-emitting control ends;

the shift register unit corresponds to at least one row of pixel circuits;

the shift register unit comprises a signal output line coupled to a light-emitting control end of the at least one row of pixel circuits for providing a light-emitting control signal to the light-emitting control end of the at least one row of pixel circuits.

When manufacturing a display substrate according to at least one embodiment of the present disclosure, firstly providing a semiconductor material layer on a base, and performing a patterning process on the semiconductor material layer so as to form an active layer of each transistor; a schematic diagram of the active layer is shown in FIG. 7;

fabricating a first gate insulating layer on a side of the active layer facing away from the base;

on the side of the first gate insulating layer facing away from the active layer, a first gate metal layer is made, and a patterning process is performed on the first gate metal layer; as shown in FIG. 8, a gate electrode of each transistor, a first plate of each capacitor and a pattern for conductive connection portion comprised in the shift register unit are formed;

using the gate electrode of each transistor as a mask, doping a part of the active layer which is not covered by the gate electrode, so that the part of the active layer which is not covered by the gate electrode is formed as a conductive part, and the part of the active layer which is covered by the gate electrode is formed as a channel part; the conductive part serves as a first electrode or a second electrode; or, the conductive part is coupled to the first electrode or the second electrode;

fabricating a second gate insulating layer on the side of the first gate metal layer facing away from the base;

providing a second gate metal layer on a side of the second gate insulating layer facing away from the first gate metal layer, and performing a patterning process on the second gate metal layer, as shown in FIG. 9, so as to form a signal output line and a second plate of each capacitor in the shift register unit; providing an insulating layer on a side of the second gate metal layer facing away from the second gate insulating layer;

as shown in FIG. 10, a plurality of via holes are provided on a base provided with an active layer, a first gate insulating layer, a first gate metal layer, a second gate insulating layer, a second gate metal layer and an insulating layer;

providing a source and drain metal layer on a side of the insulating layer facing away from the second gate metal layer; performing a patterning process on the source and drain metal layer; as shown in FIG. 11, forming a starting signal line ESTV, a first clock signal line CB, a second clock signal line CK, a first first voltage line V11, a second first voltage line V12, a second voltage line V2, a first electrode of a first output transistor T10, a second electrode of the first output transistor T10, a first electrode of the second output transistor T11, a second electrode of the second output transistor T11, and a pattern for conductive connection portion.

A display device according to at least one embodiment of the present disclosure includes a display substrate according to at least one embodiment of the present disclosure.

The display device provided by at least one embodiment of the present disclosure may be a mobile phone, a tablet computer, a television, a display, a notebook computer, a digital photo frame, a navigator, or any product or component with display functions.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting", "coupling" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the foregoing is directed to the preferred embodiments of the present disclosure, it will be understood by those skilled in the art that various changes may be made and equivalents may be substituted for elements thereof without departing from the principles of the disclosure.

What is claimed is:

1. A display substrate, comprising a base and a shift register unit provided on the base; the shift register unit comprises a first first voltage line, an on-off control circuit, a first energy storage circuit and a fourth node control circuit; the base comprises an edge area and a display area, and the shift register unit is disposed at the edge area; the on-off control circuit comprises a first transistor, and the first energy storage circuit comprises a first capacitor; the fourth node control circuit comprises a second transistor;

at least part of the first first voltage line extends in a first direction;

the first capacitor, the first transistor, the first first voltage line and the second transistor are arranged in a second direction; the second transistor, the first first voltage line, the first transistor and the first capacitor are arranged in sequence along a direction close to the display area;

the first direction intersects the second direction;

wherein the first transistor comprises a first active pattern, at least part of the first active pattern extending in the first direction;

a gate electrode of the first transistor is located in a different layer from the first first voltage line; the gate electrode of the first transistor is coupled to a first conductive connection portion, and the first conductive connection portion is coupled to the first first voltage line through a via hole.

2. The display substrate according to claim 1, wherein the shift register unit further comprises a first clock signal line, a second clock signal line, a second energy storage circuit and the fourth node control circuit, and the second energy storage circuit comprises a second capacitor;

the second capacitor is located on a side of the first first voltage line away from the display area;

the first clock signal line and the second clock signal line are located on a side of the second capacitor away from the first first voltage line.

3. The display substrate according to claim 2, wherein a first plate of the second capacitor is coupled to a second conductive connection portion, a first electrode of the first transistor is electrically connected to a third conductive connection portion through a via hole, and the third conductive connection portion is coupled to the second conductive connection portion through a via hole, so that the first electrode of the first transistor is coupled to the first plate of the second capacitor;

a second plate of the second capacitor is coupled to a first connecting conductive part that is coupled to the first clock signal line through a via hole such that the second plate of the second capacitor is coupled to the first clock signal line.

4. The display substrate according to claim 3, wherein an orthographic projection of the second plate of the second capacitor on the base does not overlap with an orthographic projection of the first first voltage line on the base.

5. The display substrate according to claim 2, wherein a gate electrode of the second transistor is coupled to a fourth conductive connection portion;

a second electrode of the first transistor is coupled to a fifth conductive connection portion through a via hole;

the fourth conductive connection portion is coupled to the fifth conductive connection portion through a via hole such that the second electrode of the first transistor is coupled to the gate electrode of the second transistor.

6. The display substrate according to claim 2, wherein the fourth node control circuit further comprises a third transistor; the third transistor is arranged between the first clock signal line and the first first voltage line;

a first electrode of the third transistor is coupled to the first first voltage line, and a second electrode of the third transistor is coupled to a sixth conductive connection portion through a via hole; the sixth conductive connection portion is coupled to a second electrode of the second transistor through a via hole so that the second electrode of the third transistor is coupled to the second electrode of the second transistor;

a gate electrode of the third transistor is coupled to a seventh conductive connection portion and an eighth conductive connection portion, and the seventh conductive connection portion is coupled to the second clock signal line through a via hole;

a first electrode of the second transistor is coupled to a ninth conductive connection portion through a via hole, and the ninth conductive connection portion is coupled to the eighth conductive connection portion through a via hole such that the first electrode of the second transistor is coupled to the gate electrode of the third transistor.

7. The display substrate according to claim 1, wherein the shift register unit further comprises a second voltage line and a first node control circuit; the second voltage line is located on a side of the first first voltage line close to the display area; the first node control circuit comprises a fourth transistor, a fifth transistor and a sixth transistor; the fourth transistor, the fifth transistor and the sixth transistor are provided between the first first voltage line and the second voltage line;

the fourth transistor comprises a fourth active pattern, the fifth transistor comprises a fifth active pattern, and the sixth transistor comprises a sixth active pattern; the fourth active pattern, the fifth active pattern and the sixth active pattern are integrally formed;

a first end of the sixth active pattern is coupled to the second voltage line; a second end of the fourth active pattern is coupled to a fifth conductive connection portion through a via hole.

8. The display substrate according to claim 7, wherein the fourth node control circuit further comprises a third transistor; the fourth transistor is located on a side of the first first voltage line away from the third transistor; a gate electrode of the third transistor is coupled to a seventh conductive connection portion and an eighth conductive connection portion, the seventh conductive connection portion is coupled to a second clock signal line through a via hole, and the eighth conductive connection portion is coupled to a gate electrode of the fourth transistor, so that the gate electrode of the fourth transistor is coupled to the second clock signal line;

a gate electrode of the fifth transistor is coupled to a tenth conductive connection portion, and the tenth conductive connection portion is coupled to a first clock signal line through a via hole, so that the gate electrode of the fifth transistor is coupled to the first clock signal line;

a second electrode of the third transistor is coupled to a sixth conductive connection portion through a via hole, a gate electrode of the sixth transistor is coupled to an eleventh conductive connection portion, and the eleventh conductive connection portion is coupled to the sixth conductive connection portion through a via hole, such that the gate electrode of the sixth transistor is coupled to the second electrode of the third transistor.

9. The display substrate according to claim 7, wherein the shift register unit further comprises a third node control circuit; the first energy storage circuit comprises a first capacitor; the third node control circuit comprises a seventh transistor and an eighth transistor; the eighth transistor and the seventh transistor are provided between the first first voltage line and the second voltage line;

the seventh transistor comprises a seventh active pattern, and the eighth transistor comprises an eighth active pattern; the seventh active pattern and the eighth active pattern are integrally formed;

a first end of the eighth active pattern is coupled to a twelfth conductive connection portion through a via hole, and the twelfth conductive connection portion is coupled to the second voltage line, so that the first end of the eighth active pattern is coupled to the second voltage line;

a first end of the seventh active pattern is coupled to a thirteenth conductive connection portion through a via hole, and the thirteenth conductive connection portion is coupled to a second plate of the first capacitor through a via hole, so that the first end of the seventh active pattern is coupled to the second plate of the first capacitor;

a first plate of the first capacitor is coupled to a gate electrode of the sixth transistor;

a gate electrode of the eighth transistor is coupled to a fourteenth conductive connection portion, the fourteenth conductive connection portion is coupled to the fifth conductive connection portion through a via hole, and the fifth conductive connection portion is coupled to a second electrode of the first transistor through a via hole, so that the gate electrode of the eighth transistor is coupled to the second electrode of the first transistor;

a gate electrode of the seventh transistor is coupled to a gate electrode of the fifth transistor.

10. The display substrate according to claim 9, wherein the shift register unit further comprises a fifth node control circuit;

the fifth node control circuit comprises a ninth transistor; the ninth transistor comprises a ninth active pattern, at least part of the ninth active pattern extends in the first direction, and the ninth transistor is located between the first capacitor and the second voltage line;

a gate electrode of the ninth transistor is coupled to the first plate of the first capacitor;

a first end of the ninth active pattern is coupled to a fifteenth conductive connection portion through a via hole, a gate electrode of the seventh transistor is coupled to a sixteenth conductive connection portion, and the fifteenth conductive connection portion is coupled to the sixteenth conductive connection portion through a via hole, so that the first end of the ninth active pattern is coupled to the gate electrode of the seventh transistor; a second end of the ninth active pattern is coupled to the thirteenth conductive connection portion through a via hole such that the second end of the ninth active pattern is coupled to the second plate of the first capacitor.

11. The display substrate according to claim 10, wherein the shift register unit further comprises a third energy storage circuit, and the third energy storage circuit comprises a third capacitor;

an orthographic projection of a first plate of the third capacitor on the base, an orthographic projection of a second plate of the third capacitor on the base, and an orthographic projection of the second voltage line on the base at least partially overlap;

the first plate of the third capacitor is coupled to a seventeenth conductive connection portion through a via hole, and the seventeenth conductive connection portion is coupled to a second end of the eighth active pattern through a via hole, so that the first plate of the third capacitor is coupled to the second end of the eighth active pattern;

a second plate of the third capacitor is coupled to the second voltage line through a via hole.

12. The display substrate according to claim 1, wherein the shift register unit further comprises a first output circuit, a second output circuit and a second first voltage line; the first output circuit comprises a first output transistor, and the second output circuit comprises a second output transistor; the first output transistor and the second output transistor are located between a second voltage line and the second first voltage line, and the second first voltage line is located on a side of the second voltage line near the display area.

13. The display substrate according to claim 12, wherein the shift register unit further comprises a signal output line, a second energy storage circuit and a third energy storage circuit; the second energy storage circuit comprises a second capacitor, and the third energy storage circuit comprises a third capacitor; a first plate of the second capacitor is coupled to a second conductive connection portion;

an active layer of the first output transistor and an active layer of the second output transistor are formed by one continuous semiconductor layer, the semiconductor layer extending in a first direction;

a first electrode of the first output transistor is coupled to a second electrode of the second output transistor, the first electrode of the first output transistor is coupled to an eighteenth conductive connection portion, and the eighteenth conductive connection portion is coupled to the signal output line through a via hole;

a second electrode of the first output transistor is coupled to the second first voltage line;

a first electrode of the second output transistor is coupled to the second voltage line;

a gate electrode of the first output transistor is coupled to the second conductive connection portion, and a gate electrode of the second output transistor is coupled to a first plate of the third capacitor.

14. The display substrate according to claim 1, wherein the shift register unit comprises the first first voltage line, a second first voltage line, a second voltage line, a first clock signal line, a second clock signal line, a signal output line, the first capacitor, a second capacitor, a third capacitor, a first transistor, a second transistor, a third transistor, a fourth transistor, a fifth transistor, a sixth transistor, a seventh transistor, an eighth transistor, a ninth transistor, a first output transistor and a second output transistor;

a gate electrode of the first transistor is coupled to the first first voltage line, a first electrode of the first transistor is coupled to a first plate of the second capacitor, and a second electrode of the first transistor is coupled to a gate electrode of the second transistor;

the gate electrode of the second transistor is coupled to the second electrode of the first transistor;

a second plate of the second capacitor is coupled to the first clock signal line;

a first electrode of the third transistor is coupled to the first first voltage line, and a second electrode of the third transistor is coupled to a second electrode of the second transistor;

a gate electrode of the third transistor is coupled to a first electrode of the second transistor;

a gate electrode of the fourth transistor is coupled to the second clock signal line; a second electrode of the fourth transistor is coupled to a second electrode of the fifth transistor; a first electrode of the fifth transistor is coupled to a second electrode of the sixth transistor; a first electrode of the sixth transistor is coupled to the second voltage line;

a gate electrode of the fifth transistor is coupled to the first clock signal line, and the second electrode of the third transistor is coupled to a gate electrode of the sixth transistor;

a first electrode of the eighth transistor is coupled to the second voltage line, a first electrode of the seventh transistor is coupled to a second plate of the first capacitor, and a first plate of the first capacitor is coupled to the gate electrode of the sixth transistor; a second electrode of the seventh transistor is coupled to a second electrode of the eighth transistor;

a gate electrode of the eighth transistor is coupled to the second electrode of the first transistor, and a gate electrode of the seventh transistor is coupled to the gate electrode of the fifth transistor;

a first electrode of the ninth transistor is coupled to the gate electrode of the seventh transistor, and a second electrode of the ninth transistor is coupled to the second plate of the first capacitor; a gate electrode of the ninth transistor is coupled to the first plate of the first capacitor;

a first plate of the third capacitor is coupled to the second electrode of the eighth transistor, and a second plate of the third capacitor is coupled to the second voltage line;

a first electrode of the first output transistor is coupled to a second electrode of the second output transistor, a second electrode of the second output transistor is coupled to the signal output line, a second electrode of the first output transistor is coupled to the second first voltage line, and a first electrode of the second output transistor is coupled to the second voltage line;

a gate electrode of the first output transistor is coupled to the first electrode of the first transistor, and a gate electrode of the second output transistor is coupled to the first plate of the third capacitor;

an orthographic projection of the first plate of the third capacitor on the base, an orthographic projection of the second plate of the third capacitor on the base, and an orthographic projection of the second voltage line on the base at least partially overlap.

15. The display substrate according to claim 14, wherein the first transistor, the fourth transistor, the fifth transistor, the sixth transistor, the seventh transistor, the eighth transistor, the ninth transistor and the first capacitor are arranged between the first first voltage line and the second voltage line, and the second transistor, the third transistor and the second capacitor are arranged between a first second voltage line and the first clock signal line;

the first clock signal line and the second clock signal line are arranged on a side of the first first voltage line away from the second voltage line;

the first output transistor and the second output transistor are arranged between the second voltage line and the second first voltage line; the second first voltage line is disposed on a side of the second voltage line away from the first first voltage line.

16. The display substrate according to claim 15, wherein the fourth transistor, the fifth transistor and the sixth transistor are arranged in sequence along the first direction;

the eighth transistor, the seventh transistor and the first capacitor are arranged in sequence along the first direction;

the eighth transistor, the fourth transistor and the third transistor are arranged in sequence along the second direction;

the first capacitor, the first transistor and the second transistor are arranged in sequence along the second direction;

at least part of the first clock signal line, at least part of the second clock signal line, at least part of the first first voltage line, at least part of the second first voltage line, and at least part of the second voltage line extend in the first direction.

17. The display substrate according to claim 1, wherein the display substrate further comprises a plurality of rows of pixel circuits arranged on the display area of the base, and the pixel circuit comprises a light-emitting control end;

the shift register unit corresponds to at least one row of pixel circuits;

the shift register unit comprises a signal output line coupled to a light-emitting control end of the at least one row of pixel circuits for providing a light-emitting control signal to the light-emitting control end of the at least one row of pixel circuits.

18. The display substrate according to claim 1, wherein the shift register unit further comprises a first clock signal line, a second clock signal line, a second energy storage circuit and a fourth node control circuit, and the second energy storage circuit comprises a second capacitor;

the second capacitor is located on a side of the first first voltage line away from the display area;

the first clock signal line and the second clock signal line are located on a side of the second capacitor away from the first first voltage line.

19. A display device comprising a display substrate, the display substrate comprising a base and a shift register unit provided on the base; the shift register unit comprises a first first voltage line, an on-off control circuit, a first energy storage circuit and a fourth node control circuit; the base comprises an edge area and a display area, and the shift register unit is disposed at the edge area; the on-off control circuit comprises a first transistor, and the first energy storage circuit comprises a first capacitor; the fourth node control circuit comprises a second transistor;

at least part of the first first voltage line extends in a first direction;

the first capacitor, the first transistor, the first first voltage line and the second transistor are arranged in a second direction; the second transistor, the first first voltage line, the first transistor and the first capacitor are arranged in sequence along a direction close to the display area;

the first direction intersects the second direction;

wherein the first transistor comprises a first active pattern, at least part of the first active pattern extending in the first direction;

a gate electrode of the first transistor is located in a different layer from the first first voltage line; the gate electrode of the first transistor is coupled to a first conductive connection portion, and the first conductive connection portion is coupled to the first first voltage line through a via hole.

* * * * *